(12) United States Patent
Swaminathan et al.

(10) Patent No.: US 10,629,435 B2
(45) Date of Patent: Apr. 21, 2020

(54) DOPED ALD FILMS FOR SEMICONDUCTOR PATTERNING APPLICATIONS

(71) Applicant: Lam Research Corporation, Fremont, CA (US)

(72) Inventors: Shankar Swaminathan, Beaverton, OR (US); Richard Phillips, Tualatin, OR (US); Adrien LaVoie, Newberg, OR (US)

(73) Assignee: Lam Research Corporation, Fremont, CA (US)

( * ) Notice: Subject to any disclaimer, the term of this patent is extended or adjusted under 35 U.S.C. 154(b) by 245 days.

(21) Appl. No.: 15/279,312

(22) Filed: Sep. 28, 2016

(65) Prior Publication Data

US 2018/0033622 A1  Feb. 1, 2018

Related U.S. Application Data

(60) Provisional application No. 62/368,922, filed on Jul. 29, 2016.

(51) Int. Cl.
*H01L 21/033* (2006.01)
*H01L 21/02* (2006.01)
(Continued)

(52) U.S. Cl.
CPC .... *H01L 21/0337* (2013.01); *C23C 16/45542* (2013.01); *H01L 21/022* (2013.01);
(Continued)

(58) Field of Classification Search
None
See application file for complete search history.

(56) References Cited

U.S. PATENT DOCUMENTS 4,158,717 A    6/1979  Nelson
4,419,809 A *  12/1983 Riseman ............. H01L 21/0337
                                                                257/344
(Continued)

FOREIGN PATENT DOCUMENTS

CN    1732288 A    2/2006
CN    1841676 A   10/2006
(Continued)

OTHER PUBLICATIONS

U.S. Notice of Allowance dated Aug. 18, 2015 issued in U.S. Appl. No. 14/494,914.
(Continued)

*Primary Examiner* — Allan W. Olsen
(74) *Attorney, Agent, or Firm* — Weaver Austin Villeneuve & Sampson LLP

(57) ABSTRACT

Methods and apparatuses for patterning substrates using a positive patterning scheme are described herein. Methods involve receiving a substrate having a patterned core material, depositing a doped spacer material conformally over the patterned core material, selectively etching the core material to the doped spacer material to form a spacer mask, and using the spacer mask to etch a target layer on the substrate. Spacer materials may be doped using any of boron, gallium, phosphorus, arsenic, aluminum, and hafnium. Embodiments are suitable for applications in multiple patterning applications.

17 Claims, 11 Drawing Sheets

(51) Int. Cl.
*H01L 21/311* (2006.01)
*C23C 16/455* (2006.01)

(52) U.S. Cl.
CPC .... *H01L 21/0228* (2013.01); *H01L 21/02112* (2013.01); *H01L 21/02129* (2013.01); *H01L 21/02164* (2013.01); *H01L 21/02274* (2013.01); *H01L 21/31138* (2013.01)

(56) References Cited

U.S. PATENT DOCUMENTS

| | | | |
|---|---|---|---|
| 4,500,563 A | 2/1985 | Ellenberger et al. | |
| 4,575,921 A | 3/1986 | Bhagat | |
| 4,869,781 A | 9/1989 | Euen et al. | |
| 5,091,332 A | 2/1992 | Bohr et al. | |
| 5,202,272 A * | 4/1993 | Hsieh | H01L 21/28132 257/E21.444 |
| 5,230,929 A | 7/1993 | Caporiccio et al. | |
| 5,314,724 A | 5/1994 | Tsukune et al. | |
| 5,459,099 A | 10/1995 | Hsu | |
| 5,496,608 A | 3/1996 | Matsuda et al. | |
| 5,528,719 A * | 6/1996 | Yamada | G02B 6/30 385/137 |
| 5,670,432 A | 9/1997 | Tsai | |
| 5,731,235 A | 3/1998 | Srinivasan et al. | |
| 5,854,105 A * | 12/1998 | Tseng | H01L 27/10817 438/253 |
| 5,856,003 A | 1/1999 | Chiu | |
| 5,891,805 A | 4/1999 | Cheng et al. | |
| 5,976,990 A | 11/1999 | Mercaldi et al. | |
| 6,039,834 A | 3/2000 | Tanaka et al. | |
| 6,153,519 A | 11/2000 | Jain et al. | |
| 6,197,701 B1 | 3/2001 | Shue et al. | |
| 6,225,175 B1 * | 5/2001 | Houston | H01L 21/0338 257/E21.039 |
| 6,228,779 B1 | 5/2001 | Bloom et al. | |
| 6,326,322 B1 | 12/2001 | Kim et al. | |
| 6,380,056 B1 | 4/2002 | Shue et al. | |
| 6,395,652 B2 | 5/2002 | Kim et al. | |
| 6,403,416 B1 * | 6/2002 | Huang | H01L 28/91 257/E21.019 |
| 6,416,822 B1 | 7/2002 | Chiang et al. | |
| 6,428,859 B1 | 8/2002 | Chiang et al. | |
| 6,518,167 B1 | 2/2003 | You et al. | |
| 6,534,395 B2 | 3/2003 | Werkhoven et al. | |
| 6,548,368 B1 | 4/2003 | Narwankar et al. | |
| 6,632,478 B2 | 10/2003 | Gaillard et al. | |
| 6,632,741 B1 | 10/2003 | Clevenger et al. | |
| 6,638,879 B2 | 10/2003 | Hsieh et al. | |
| 6,645,574 B1 | 11/2003 | Lee et al. | |
| 6,709,928 B1 | 3/2004 | Jenne et al. | |
| 6,730,614 B1 | 5/2004 | Lim et al. | |
| 6,794,284 B2 | 9/2004 | Vaartstra | |
| 6,926,798 B2 | 8/2005 | Biberger et al. | |
| 6,933,245 B2 | 8/2005 | Lee et al. | |
| 6,967,159 B2 | 11/2005 | Vaartstra | |
| 7,019,159 B2 | 3/2006 | Dussarrat et al. | |
| 7,041,335 B2 | 5/2006 | Chung | |
| 7,172,792 B2 | 2/2007 | Wang et al. | |
| 7,297,641 B2 | 11/2007 | Todd et al. | |
| 7,300,885 B2 | 11/2007 | Hasebe et al. | |
| 7,301,210 B2 * | 11/2007 | Abadeer | H01L 21/845 257/328 |
| 7,351,668 B2 | 4/2008 | Chou et al. | |
| 7,462,571 B2 | 12/2008 | Hasebe et al. | |
| 7,465,669 B2 | 12/2008 | Iyer et al. | |
| 7,482,247 B1 | 1/2009 | Papasouliotis et al. | |
| 7,507,676 B2 | 3/2009 | Chou et al. | |
| 7,510,984 B2 | 3/2009 | Saito et al. | |
| 7,514,366 B2 | 4/2009 | Trivedi et al. | |
| 7,611,980 B2 * | 11/2009 | Wells | H01L 21/0337 257/435 |
| 7,622,369 B1 | 11/2009 | Lee et al. | |
| 7,629,267 B2 | 12/2009 | Wan et al. | |
| 7,651,730 B2 | 1/2010 | Hasebe | |
| 7,651,953 B2 | 1/2010 | Todd et al. | |
| 7,651,959 B2 | 1/2010 | Fukazawa et al. | |
| 7,682,657 B2 | 3/2010 | Sherman | |
| 7,700,492 B2 * | 4/2010 | Kikuchi | H01J 37/32568 438/706 |
| 7,713,592 B2 | 5/2010 | Nguyen et al. | |
| 7,732,343 B2 * | 6/2010 | Niroomand | H01L 21/0338 257/E21.038 |
| 7,758,920 B2 | 7/2010 | Hasebe et al. | |
| 7,807,578 B2 * | 10/2010 | Bencher | H01L 21/0332 257/E21.249 |
| 7,825,039 B2 | 11/2010 | Takahashi et al. | |
| 7,910,288 B2 * | 3/2011 | Abatchev | H01L 21/0337 430/313 |
| 7,910,497 B2 | 3/2011 | Olsen et al. | |
| 7,919,416 B2 | 4/2011 | Lee et al. | |
| 7,939,455 B2 | 5/2011 | Clark | |
| 7,964,241 B2 | 6/2011 | Hasebe et al. | |
| 7,964,513 B2 | 6/2011 | Todd et al. | |
| 7,989,365 B2 | 8/2011 | Park et al. | |
| 8,034,673 B2 | 10/2011 | Kadonaga et al. | |
| 8,080,290 B2 | 12/2011 | Hasebe et al. | |
| 8,084,088 B2 | 12/2011 | Huy et al. | |
| 8,105,901 B2 * | 1/2012 | Cheng | H01L 21/2236 257/401 |
| 8,119,544 B2 | 2/2012 | Hasebe et al. | |
| 8,178,448 B2 | 5/2012 | Nodera et al. | |
| 8,227,032 B2 | 7/2012 | Dussarrat et al. | |
| 8,257,789 B2 | 9/2012 | Matsunaga et al. | |
| 8,298,628 B2 | 10/2012 | Yang et al. | |
| 8,298,954 B1 * | 10/2012 | Arnold | H01L 21/0337 257/E21.235 |
| 8,366,953 B2 | 2/2013 | Kohno et al. | |
| 8,383,525 B2 | 2/2013 | Raisanen et al. | |
| 8,394,466 B2 | 3/2013 | Hong et al. | |
| 8,592,328 B2 | 11/2013 | Hausmann et al. | |
| 8,623,770 B1 * | 1/2014 | Gao | H01L 21/02186 257/E21.236 |
| 8,669,185 B2 | 3/2014 | Onizawa et al. | |
| 8,703,578 B2 | 4/2014 | Hoentschel et al. | |
| 8,728,956 B2 | 5/2014 | LaVoie et al. | |
| 8,753,984 B2 | 6/2014 | Murakami et al. | |
| 8,791,034 B2 | 7/2014 | Shealy et al. | |
| 8,846,484 B2 | 9/2014 | Lee et al. | |
| 8,936,977 B2 | 1/2015 | Hoentschel et al. | |
| 8,975,704 B2 | 3/2015 | Hoentschel et al. | |
| 9,023,693 B1 | 5/2015 | Lin et al. | |
| 9,023,737 B2 | 5/2015 | Beynet et al. | |
| 9,070,555 B2 | 6/2015 | Hausmann et al. | |
| 9,095,869 B2 | 8/2015 | Kilpi et al. | |
| 9,214,333 B1 | 12/2015 | Sims et al. | |
| 9,355,839 B2 * | 5/2016 | Swaminathan | C23C 16/45527 |
| 9,390,909 B2 * | 7/2016 | Pasquale | H01L 21/02274 |
| 9,406,693 B1 | 8/2016 | Pang et al. | |
| 9,443,731 B1 * | 9/2016 | O'Meara | H01L 21/31144 |
| 9,472,506 B2 * | 10/2016 | Conklin | H01L 23/544 |
| 9,502,238 B2 | 11/2016 | Danek et al. | |
| 9,508,604 B1 * | 11/2016 | Sung | H01L 21/823821 |
| 9,530,663 B1 * | 12/2016 | Shih | H01L 21/3086 |
| 9,564,312 B2 | 2/2017 | Henri et al. | |
| 9,576,817 B1 * | 2/2017 | Cheng | H01L 21/31144 |
| 9,589,790 B2 | 3/2017 | Henri et al. | |
| 9,601,693 B1 | 3/2017 | Henri et al. | |
| 9,670,579 B2 | 6/2017 | Hausmann et al. | |
| 9,721,784 B2 * | 8/2017 | Behera | H01L 21/02115 |
| 9,865,815 B2 | 1/2018 | Hausmann et al. | |
| 9,875,891 B2 * | 1/2018 | Henri | H01L 21/0228 |
| 9,892,933 B2 * | 2/2018 | Peng | H01L 21/31116 |
| 10,074,543 B2 | 9/2018 | Mahorowala et al. | |
| 10,134,579 B2 | 11/2018 | Baldasseroni et al. | |
| 10,141,505 B2 | 11/2018 | Hausmann et al. | |
| 10,269,559 B2 | 4/2019 | Abel et al. | |
| 2002/0001889 A1 | 1/2002 | Kim et al. | |
| 2002/0001929 A1 | 1/2002 | Biberger et al. | |
| 2003/0143841 A1 | 7/2003 | Yang et al. | |
| 2004/0043570 A1 | 3/2004 | Fujisaki et al. | |
| 2005/0025885 A1 | 2/2005 | McSwiney et al. | |
| 2005/0042865 A1 | 2/2005 | Cabral et al. | |
| 2005/0100670 A1 | 5/2005 | Dussarrat et al. | |

(56) References Cited

U.S. PATENT DOCUMENTS

| | | |
|---|---|---|
| 2005/0109276 A1 | 5/2005 | Iyer et al. |
| 2005/0118837 A1 | 6/2005 | Todd et al. |
| 2005/0158983 A1 | 7/2005 | Hoshi et al. |
| 2005/0159017 A1 | 7/2005 | Kim et al. |
| 2005/0170104 A1 | 8/2005 | Jung et al. |
| 2005/0196977 A1 | 9/2005 | Saito et al. |
| 2005/0227017 A1 | 10/2005 | Senzaki et al. |
| 2005/0287309 A1 | 12/2005 | Veerasamy |
| 2005/0287775 A1 | 12/2005 | Hasebe et al. |
| 2006/0003557 A1 | 1/2006 | Cabral et al. |
| 2006/0008656 A1 | 1/2006 | Veerasamy |
| 2006/0032442 A1 | 2/2006 | Hasebe |
| 2006/0084283 A1 | 4/2006 | Paranjpe et al. |
| 2006/0088985 A1 | 4/2006 | Haverkort et al. |
| 2006/0119248 A1 | 6/2006 | Howard et al. |
| 2006/0199357 A1 | 9/2006 | Wan et al. |
| 2006/0273456 A1 | 12/2006 | Sant et al. |
| 2006/0286776 A1 | 12/2006 | Ranish et al. |
| 2006/0289385 A1* | 12/2006 | Kikuchi ............ H01J 37/32568 216/67 |
| 2007/0032047 A1 | 2/2007 | Hasebe et al. |
| 2007/0099431 A1 | 5/2007 | Li |
| 2007/0137572 A1 | 6/2007 | Matsuura et al. |
| 2007/0148968 A1 | 6/2007 | Kwon et al. |
| 2007/0167028 A1 | 7/2007 | Chou et al. |
| 2007/0218661 A1* | 9/2007 | Shroff ............. H01L 21/823418 438/510 |
| 2007/0238299 A1 | 10/2007 | Niroomand et al. |
| 2007/0238316 A1 | 10/2007 | Ohashi |
| 2007/0251444 A1 | 11/2007 | Gros et al. |
| 2007/0298585 A1 | 12/2007 | Lubomirsky et al. |
| 2008/0038936 A1 | 2/2008 | Todd et al. |
| 2008/0063791 A1 | 3/2008 | Hasebe et al. |
| 2008/0081470 A1 | 4/2008 | Clark |
| 2008/0119057 A1 | 5/2008 | Chua et al. |
| 2008/0124946 A1 | 5/2008 | Xiao et al. |
| 2008/0138996 A1 | 6/2008 | Nishizuka |
| 2008/0139003 A1 | 6/2008 | Pirzada et al. |
| 2008/0213479 A1 | 9/2008 | Chou et al. |
| 2008/0237726 A1 | 10/2008 | Dyer |
| 2008/0242116 A1 | 10/2008 | Clark |
| 2008/0260969 A1 | 10/2008 | Dussarrat et al. |
| 2008/0274302 A1 | 11/2008 | Hasebe et al. |
| 2008/0311760 A1 | 12/2008 | Nodera et al. |
| 2008/0318443 A1 | 12/2008 | Kim et al. |
| 2009/0018668 A1 | 1/2009 | Galbraith |
| 2009/0075490 A1 | 3/2009 | Dussarrat |
| 2009/0146322 A1 | 6/2009 | Weling et al. |
| 2009/0148625 A1 | 6/2009 | Yeom et al. |
| 2009/0155606 A1 | 6/2009 | Yoon et al. |
| 2009/0163041 A1 | 6/2009 | Mungekar et al. |
| 2009/0191722 A1 | 7/2009 | Hasebe et al. |
| 2009/0286381 A1 | 11/2009 | van Schravendijk et al. |
| 2010/0003797 A1* | 1/2010 | Smith ................ H01L 29/0653 438/279 |
| 2010/0038727 A1 | 2/2010 | Chakravarthi et al. |
| 2010/0099271 A1 | 4/2010 | Hausmann et al. |
| 2010/0102407 A1 | 4/2010 | Kajiyama et al. |
| 2010/0124618 A1 | 5/2010 | Kobayashi et al. |
| 2010/0124621 A1 | 5/2010 | Kobayashi et al. |
| 2010/0136260 A1 | 6/2010 | Matsunaga et al. |
| 2010/0136313 A1 | 6/2010 | Shimizu et al. |
| 2010/0151681 A1 | 6/2010 | Knapp et al. |
| 2010/0221925 A1 | 9/2010 | Lee et al. |
| 2010/0267238 A1 | 10/2010 | Johnson et al. |
| 2010/0304047 A1 | 12/2010 | Yang et al. |
| 2010/0304574 A1 | 12/2010 | Nodera et al. |
| 2010/0310791 A1 | 12/2010 | Shimazu et al. |
| 2011/0003477 A1 | 1/2011 | Park et al. |
| 2011/0014795 A1 | 1/2011 | Lee et al. |
| 2011/0021010 A1* | 1/2011 | Cheng ................ H01L 21/2236 438/513 |
| 2011/0086516 A1 | 4/2011 | Lee et al. |
| 2011/0127582 A1* | 6/2011 | Cheng ................ H01L 21/0337 257/213 |
| 2011/0129978 A1* | 6/2011 | Cheng ............... H01L 29/66803 438/302 |
| 2011/0151142 A1 | 6/2011 | Seamons et al. |
| 2011/0176967 A1 | 7/2011 | Okuda et al. |
| 2011/0183528 A1 | 7/2011 | Wang et al. |
| 2011/0244142 A1* | 10/2011 | Cheng .................... C23C 16/26 427/569 |
| 2011/0256734 A1 | 10/2011 | Hausmann et al. |
| 2012/0009802 A1 | 1/2012 | LaVoie et al. |
| 2012/0009803 A1 | 1/2012 | Jung et al. |
| 2012/0028469 A1 | 2/2012 | Onizawa et al. |
| 2012/0058282 A1 | 3/2012 | Hong et al. |
| 2012/0068347 A1 | 3/2012 | Isobayashi et al. |
| 2012/0104347 A1 | 5/2012 | Quick |
| 2012/0108079 A1 | 5/2012 | Mahajani |
| 2012/0115074 A1 | 5/2012 | Zhang et al. |
| 2012/0142194 A1* | 6/2012 | Hwang ............... H01L 21/0337 438/703 |
| 2012/0156882 A1* | 6/2012 | Lee .................... H01L 21/0337 438/703 |
| 2012/0156888 A1* | 6/2012 | Sato ......................... C23C 8/36 438/716 |
| 2012/0164846 A1 | 6/2012 | Ha et al. |
| 2012/0171846 A1 | 7/2012 | Hwang |
| 2012/0177841 A1 | 7/2012 | Thompson |
| 2012/0213940 A1 | 8/2012 | Mallick |
| 2012/0244711 A1 | 9/2012 | Yin et al. |
| 2012/0264305 A1 | 10/2012 | Nakano |
| 2012/0282418 A1 | 11/2012 | Chou et al. |
| 2012/0315394 A1 | 12/2012 | Ito |
| 2013/0071580 A1 | 3/2013 | Weidman et al. |
| 2013/0084688 A1 | 4/2013 | O'Meara et al. |
| 2013/0113073 A1 | 5/2013 | Liu et al. |
| 2013/0115783 A1 | 5/2013 | Kim et al. |
| 2013/0189845 A1* | 7/2013 | Kim .................. H01L 21/02115 438/696 |
| 2013/0189854 A1 | 7/2013 | Hausmann et al. |
| 2013/0210236 A1 | 8/2013 | Ogihara et al. |
| 2013/0252437 A1 | 9/2013 | Sano et al. |
| 2013/0327636 A1* | 12/2013 | Majetich .................... C23F 1/04 204/192.34 |
| 2013/0344248 A1 | 12/2013 | Clark |
| 2014/0023794 A1 | 1/2014 | Mahajani et al. |
| 2014/0113455 A1 | 4/2014 | Reimer et al. |
| 2014/0113457 A1 | 4/2014 | Sims et al. |
| 2014/0120737 A1* | 5/2014 | Swaminathan ... C23C 16/45527 438/765 |
| 2014/0134812 A1 | 5/2014 | Kim et al. |
| 2014/0141625 A1 | 5/2014 | Fukazawa et al. |
| 2014/0141626 A1 | 5/2014 | Hausmann et al. |
| 2014/0170853 A1 | 6/2014 | Shamma et al. |
| 2014/0193983 A1 | 7/2014 | LaVoie |
| 2014/0216337 A1* | 8/2014 | Swaminathan ........ C23C 16/045 118/704 |
| 2014/0262038 A1 | 9/2014 | Wang et al. |
| 2014/0273477 A1 | 9/2014 | Niskanen et al. |
| 2014/0273528 A1 | 9/2014 | Niskanen et al. |
| 2014/0273529 A1 | 9/2014 | Nguyen et al. |
| 2014/0273530 A1 | 9/2014 | Nguyen et al. |
| 2014/0273531 A1 | 9/2014 | Niskanen et al. |
| 2014/0302686 A1 | 10/2014 | Pan et al. |
| 2015/0021712 A1* | 1/2015 | Zschaetzsch ........ H01L 21/2254 257/402 |
| 2015/0031218 A1 | 1/2015 | Karakawa |
| 2015/0056540 A1 | 2/2015 | Fukuda |
| 2015/0126042 A1* | 5/2015 | Pasquale ........... H01L 21/02274 438/761 |
| 2015/0132965 A1 | 5/2015 | deVilliers et al. |
| 2015/0137061 A1 | 5/2015 | Donghi et al. |
| 2015/0155198 A1 | 6/2015 | Tsai et al. |
| 2015/0162416 A1 | 6/2015 | Chang et al. |
| 2015/0200110 A1 | 7/2015 | Li et al. |
| 2015/0243708 A1 | 8/2015 | Ravasio et al. |
| 2015/0249153 A1 | 9/2015 | Morin et al. |
| 2015/0251917 A1 | 9/2015 | Hong et al. |
| 2015/0259791 A1 | 9/2015 | Hausmann et al. |

(56) References Cited

U.S. PATENT DOCUMENTS

| | | | |
|---|---|---|---|
| 2016/0020092 A1 | 1/2016 | Kang et al. | |
| 2016/0046501 A1 | 2/2016 | Kverel et al. | |
| 2016/0049307 A1* | 2/2016 | Chen | H01L 21/0337 |
| | | | 438/696 |
| 2016/0064224 A1 | 3/2016 | Hung et al. | |
| 2016/0079054 A1 | 3/2016 | Chen et al. | |
| 2016/0093484 A1 | 3/2016 | Marsh | |
| 2016/0099143 A1 | 4/2016 | Yan et al. | |
| 2016/0109804 A1 | 4/2016 | Huli | |
| 2016/0148800 A1 | 5/2016 | Henri et al. | |
| 2016/0148806 A1 | 5/2016 | Henri et al. | |
| 2016/0155739 A1* | 6/2016 | Ting | H01L 29/0653 |
| | | | 257/401 |
| 2016/0172194 A1 | 6/2016 | Kunnen et al. | |
| 2016/0225640 A1* | 8/2016 | Raley | H01L 21/31144 |
| 2016/0247678 A1 | 8/2016 | Feng et al. | |
| 2016/0247680 A1* | 8/2016 | O'Meara | H01L 21/31144 |
| 2016/0284567 A1 | 9/2016 | Reilly et al. | |
| 2016/0293398 A1 | 10/2016 | Danek et al. | |
| 2016/0293418 A1 | 10/2016 | Pasquale et al. | |
| 2016/0300718 A1* | 10/2016 | Raley | H01L 21/0273 |
| 2016/0336178 A1* | 11/2016 | Swaminathan | C23C 16/045 |
| 2016/0336187 A1 | 11/2016 | Liou et al. | |
| 2016/0365425 A1 | 12/2016 | Chen et al. | |
| 2016/0372334 A1* | 12/2016 | Mignot | H01L 21/31116 |
| 2017/0069510 A1* | 3/2017 | Kal | H01L 21/31144 |
| 2017/0092496 A1 | 3/2017 | deVilliers | |
| 2017/0092857 A1 | 3/2017 | Hausmann et al. | |
| 2017/0110550 A1* | 4/2017 | Tsai | H01L 29/4966 |
| 2017/0117134 A1 | 4/2017 | Henri et al. | |
| 2017/0148637 A1 | 5/2017 | deVilliers | |
| 2017/0170015 A1* | 6/2017 | Kim | H01L 21/0337 |
| 2017/0170026 A1 | 6/2017 | Hudson et al. | |
| 2017/0323785 A1 | 11/2017 | Singhal et al. | |
| 2018/0005814 A1 | 1/2018 | Kumar et al. | |
| 2018/0061628 A1 | 3/2018 | Ou et al. | |
| 2018/0061650 A1 | 3/2018 | Mahorowala | |
| 2018/0114903 A1 | 4/2018 | Hausmann | |
| 2018/0138028 A1 | 5/2018 | Henri et al. | |
| 2018/0138036 A1 | 5/2018 | Baldasseroni et al. | |
| 2018/0138040 A1 | 5/2018 | LaVoie | |
| 2018/0138405 A1 | 5/2018 | McKerrow et al. | |
| 2019/0080903 A1 | 3/2019 | Abel et al. | |
| 2019/0206677 A1 | 7/2019 | Abel et al. | |

FOREIGN PATENT DOCUMENTS

| | | |
|---|---|---|
| CN | 101006195 A | 7/2007 |
| CN | 101255548 A | 9/2008 |
| CN | 101328578 A | 12/2008 |
| CN | 101378007 A | 3/2009 |
| CN | 102471885 A | 5/2012 |
| CN | 103225071 A | 7/2013 |
| CN | 103515197 A | 1/2014 |
| CN | 104046955 A | 9/2014 |
| EP | 0 277 766 | 8/1988 |
| EP | 2 278 046 A1 | 1/2011 |
| GB | 1 181 559 | 2/1970 |
| JP | 2005-210076 A | 8/2005 |
| JP | 2006-060091 | 3/2006 |
| JP | 2007-281181 A | 10/2007 |
| JP | 2008-517479 | 5/2008 |
| JP | 2009-170823 A | 7/2009 |
| JP | 2010-10497 | 1/2010 |
| JP | 2010-527138 A | 8/2010 |
| JP | 2010-283388 A | 12/2010 |
| JP | 2011-192776 A | 9/2011 |
| JP | 2012-142574 A | 7/2012 |
| JP | 2012-169408 A | 9/2012 |
| JP | 2013225655 A | 10/2013 |
| JP | 2014-532304 A | 12/2014 |
| KR | 10-2009-0080019 | 7/2009 |
| KR | 10-2015-0025224 | 3/2015 |
| TW | 2010-33739 A | 9/2010 |
| TW | 2016-06855 A | 2/2016 |
| WO | WO 2006/018441 | 2/2006 |
| WO | WO 2006/026350 | 3/2006 |
| WO | WO 2011/130397 | 10/2011 |
| WO | WO 2013/043330 | 3/2013 |
| WO | WO 2013/066667 | 5/2013 |

OTHER PUBLICATIONS

U.S. Office Action dated Oct. 1, 2015 issued in U.S. Appl. No. 14/552,245.
U.S. Notice of Allowance dated Feb. 1, 2016 issued in U.S. Appl. No. 14/552,245.
U.S. Office Action dated May 24, 2016 issued in U.S. Appl. No. 14/552,245.
U.S. Notice of Allowance dated Oct. 26, 2016 issued in U.S. Appl. No. 14/552,245.
U.S. Office Action dated May 25, 2016 issued in U.S. Appl. No. 14/552,011.
U.S. Notice of Allowance dated Sep. 26, 2016 issued in U.S. Appl. No. 14/552,011.
U.S. Notice of Allowance dated Jul. 15, 2016 issued in U.S. Appl. No. 14/678,736.
U.S. Office Action dated Apr. 18, 2016 issued in U.S. Appl. No. 14/935,317.
U.S. Notice of Allowance dated Sep. 19, 2016 issued in U.S. Appl. No. 14/935,317.
U.S. Office Action dated May 19, 2017 issued in U.S. Appl. No. 15/272,222.
U.S. Notice of Allowance dated Sep. 1, 2017 issued in U.S. Appl. No. 15/272,222.
U.S. Office Action dated Sep. 14, 2012 issued in U.S. Appl. No. 13/084,305.
U.S. Final Office Action dated Apr. 25, 2013 issued in U.S. Appl. No. 13/084,305.
U.S. Office Action dated Jun. 7, 2013 issued U.S. Appl. No. 13/414,619.
U.S. Notice of Allowance dated Jul. 26, 2013, issued U.S. Appl. No. 13/414,619.
U.S. Office Action dated Apr. 11, 2014 issued in U.S. Appl. No. 14/065,334.
U.S. Final Office Action dated Nov. 14, 2014 issued in U.S. Appl. No. 14/065,334.
U.S. Notice of Allowance dated Feb. 17, 2015 issued in U.S. Appl. No. 14/065,334.
U.S. Notice of Allowance dated Feb. 8, 2017 issued in U.S. Appl. No. 14/713,639.
PCT Invitation to Pay Additional Fees; Communication Re Partial International Search, dated Dec. 16, 2011, issued in PCT/US2011/032303.
PCT International Search Report and Written Opinion, dated Feb. 20, 2012, issued in PCT/US2011/032303.
PCT International Preliminary Report on Patentability and Written Opinion, dated Oct. 26, 2012, issued in PCT/US2011/032303.
Chinese First Office Action dated May 19, 2016 issued in CN 201310021460.8.
Chinese Second Office Action dated Apr. 13, 2017 issued in CN 201310021460.8.
European Extended Search Report dated Apr. 14, 2014 issued in EP 13 152 046.2.
Japanese Office Action dated Jan. 10, 2017 issued in JP 2013-007612.
Korean Notice of Provisional Rejection dated Dec. 6, 2013 issued in KR 10-2012-0043797.
Korean Final Office Action dated Aug. 18, 2014 issued in KR 10-2012-0043797.
Korean Decision from the Patent Tribunal of the KIPO [description] dated May 26, 2015 issued in KR 10-2012-0043797.
Taiwan Examination Report dated Mar. 29, 2017 issued in TW 102102054.
Aboaf, J.A. (1969) "Some Properties of Vapor Deposited Silicon Nitride Films Obtained by the Reaction of SiBr4 and NH 3," *Journal of the Electrochemical Society*, 116(12):1736-1740.

(56) References Cited

OTHER PUBLICATIONS

Becker, F.S. and Rohl, S. (Nov. 1987) "Low Pressure Deposition of Doped $SiO_2$ by Pyrolysis of Tetraethylorthosilicate (TEOS)," *J. Electrochem. Soc.: Solid-State Science and Technology*, 134(11):2923-2931.
Cecchi et al., (2007) "Ultra-thin conformal pore-sealing of low-k materials by plasma-assisted ALD," *University of New Mexico, Albuquerque, NM, Sandia National Labs*, Albuquerque, NM, 1 page.
King, Sean W., (Jul./Aug. 2011) "Plasma enhanced atomic layer deposition of $SiN_x$:H and $SiO_2$," *J. Vac. Sci. Technol.* A29(4):041501-1 through 041501-9 (9 pages).
Kunnen et al., (2015) "A way to integrate multiple block layers for middle of line contact patterning," *Proc. of SPIE*, 9428:94280W1-8 [Downloaded on Jun. 27, 2017 from http://proceedings.spiedigitallibrary.org].
Lin et al., (1998) "Silicon Nitride Films Deposited by Atmospheric Pressure Chemical Vapor Deposition," *Materials Research Society Symposium Proceedings* vol. 495, Chemical Aspects of Electronic Ceramics Processing, Symposium held Nov. 30-Dec. 4, 1997, Boston, Massachusetts, U.S.A., 8 pages.
Plasma Enhanced Atomic Layer Deposition (PEALD), Website: http://www.asm.com/index.php?option=com_content&task=view&id=19&Itemid=161 (2010), 1 page.
"PlasmaPro™ NGP® 80 Range," *Oxford Instruments* (2010), 8 pages.
U.S. Appl. No. 15/201,221, filed Jul. 1, 2016, Kumar et al.
U.S. Appl. No. 15/253,301, filed Aug. 31, 2016, Ou et al.
U.S. Appl. No. 15/253,546, filed Aug. 31, 2016, Mahorowala et al.
U.S. Appl. No. 15/258,789, filed Sep. 7, 2016, Sims et al.
U.S. Appl. No. 15/279,314, filed Sep. 28, 2016, Singhal et al.
U.S. Appl. No. 15/349,746, filed Nov. 11, 2016, LaVoie.
U.S. Appl. No. 15/349,753, filed Nov. 11, 2016, McKerrow et al.
U.S. Appl. No. 15/351,221, filed Nov. 14, 2016, Baldasseroni et al.
U.S. Office Action dated Apr. 7, 2017 issued in U.S. Appl. No. 15/279,314.
U.S. Office Action dated Mar. 10, 2017 issued in U.S. Appl. No. 15/258,789.
U.S. Final Office Action dated Jul. 14, 2017 issued in U.S. Appl. No. 15/258,789.
U.S. Notice of Allowance dated Aug. 30, 2017 issued in U.S. Appl. No. 15/258,789.
U.S. Office Action dated Jul. 5, 2017 issued in U.S. Appl. No. 15/351,221.
U.S. Office Action dated Jul. 14, 2017 issued in U.S. Appl. No. 15/349,746.
U.S. Notice of Allowance dated Sep. 28, 2017 issued in U.S. Appl. No. 15/399,637.
U.S. Office Action dated Jul. 30, 2019 issued in U.S. Appl. No. 15/847,744.
U.S. Notice of Allowance dated Jul. 26, 2018 issued in U.S. Appl. No. 15/829,702.
U.S. Final Office Action dated Oct. 19, 2017 issued in U.S. Appl. No. 15/279,314.
U.S. Office Action dated Oct. 6, 2017 issued in U.S. Appl. No. 15/253,546.
U.S. Notice of Allowance dated Apr. 25, 2018 issued in U.S. Appl. No. 15/253,546.
U.S. Final Office Action dated Jan. 2, 2018 issued in U.S. Appl. No. 15/351,221.
U.S. Notice of Allowance dated Jul. 16, 2018 issued in U.S. Appl. No. 15/351,221.
U.S. Final Office Action dated Jan. 18, 2018 issued in U.S. Appl. No. 15/349,746.
U.S. Office Action dated Jun. 29, 2018 issued in U.S. Appl. No. 15/349,746.
U.S. Final Office Action dated Dec. 21, 2018 issued in U.S. Appl. No. 15/349,746.
U.S. Advisory Action dated May 20, 2019 issued in U.S. Appl. No. 15/349,746.
U.S. Office Action dated Jun. 14, 2019 issued in U.S. Appl. No. 15/349,746.
U.S. Office Action dated Oct. 23, 2017 issued in U.S. Appl. No. 15/349,753.
U.S. Final Office Action dated Apr. 20, 2018 issued in U.S. Appl. No. 15/349,753.
U.S. Office Action dated Sep. 28, 2018 issued in U.S. Appl. No. 15/349,753.
U.S. Notice of Allowance dated Jun. 17, 2019 issued in U.S. Appl. No. 15/349,753.
U.S. Office Action dated Jul. 18, 2018 issued in U.S. Appl. No. 15/703,917.
U.S. Notice of Allowance dated Dec. 5, 2018 issued in U.S. Appl. No. 15/703,917.
Chinese First Office Action dated Nov. 8, 2017 issued in Application No. CN 201510615853.0.
Taiwanese First Office Action dated Apr. 25, 2019 issued in Application No. TW 104131344.
Taiwanese First Office Action dated Jun. 13, 2019 issued in Application No. TW 104138370.
Chinese First Office Action dated Mar. 30, 2018 issued in Application No. CN 201610206201.6.
Chinese Second Office Action dated Jan. 24, 2019 issued in Application No. CN 201610206201.6.
Japanese First Office Action dated May 28, 2019 issued in Application No. JP 2017-143195.
Taiwan First Office Action dated Feb. 27, 2019, issued in Application No. TW 106124691.
International Search Report and Written Opinion dated Feb. 13, 2018 issued in Application No. PCT/US2017/060692.
International Preliminary Report on Patentability dated May 23, 2019 issued in Application No. PCT/US17/60692.
International Search Report and Written Opinion dated Feb. 21, 2018 issued in Application No. PCT/US2017/060240.
International Preliminary Report on Patentability dated May 23, 2019 issued in Application No. PCT/US17/60240.
International Search Report and Written Opinion dated Feb. 25, 2019 issued in Application No. PCT/US2018/050049.
Chinese Third Office Action dated Oct. 17, 2017 issued in Application No. CN 201310021460.8.
Chinese Fourth Office Action dated May 16, 2018 issued in Application No. CN 201310021460.8.
European Examination Report dated Dec. 11, 2017 issued in Application No. EP 13 15 2046.
Japanese Second Office Action [Decision of Rejection] dated Jan. 9, 2018 issued in Application No. JP 2013-007612.
Japanese Third Office Action [Reasons for Refusal] dated Apr. 2, 2019 issued in Application No. JP 2013-007612.
Japanese First Office Action [Reasons for Refusal] dated May 29, 2019 issued in Application No. JP 2018-090402.
Huang et al. (2017) "Design of efficient mono-aminosilane precursors for atomic layer deposition of $SiO_2$ thin films," *Royal Society of Chemistry Adv.* 2017, 7:22672-22678.
*Wikipedia, The Free Encyclopedia*, Definition of "Silicon Nitride," Archived from Apr. 9, 2015, 1 page [Downloaded on Oct. 12, 2017 from https://web.archive.org/web/20150409055521/https://en.wikipedia.org/wiki/Silicon_nitride].
Japanese Second Office Action dated Dec. 24, 2019 issued in Application No. JP 2017-143195.

* cited by examiner

US 10,629,435 B2

DOPED ALD FILMS FOR SEMICONDUCTOR PATTERNING APPLICATIONS

CROSS-REFERENCE TO RELATED APPLICATION

This application claims benefit of U.S. Provisional Patent Application No. 62/368,922, filed Jul. 29, 2016, and titled "DOPED ALD FILMS FOR SEMICONDUCTOR PATTERNING APPLICATIONS," which is incorporated by reference herein in its entirety and for all purposes.

BACKGROUND

Fabrication of advanced integrated circuits often involves patterning of small features in high volume manufacturing of semiconductors. Multiple patterning techniques may enable feature size scaling based on lithographic techniques such as 193 nm immersion lithography. Self-aligned double patterning is an example of a multiple patterning technique.

SUMMARY

Provided herein are methods and apparatus of processing semiconductor substrates. One aspect involves a method of patterning a substrate using positive patterning, the method including: providing the substrate having a patterned core material; depositing a doped spacer conformally over the core material; etching the core material selective to the spacer to form a mask, whereby etch rate of the core material is between about 5 and about 20 times faster than etch rate of the doped spacer; and etching a target layer using the mask.

Depositing the doped spacer may include depositing one or more layers of silicon oxide and depositing one or more layers of a dopant oxide, the dopant being any one of boron, gallium, phosphorous, aluminum, and arsenic. In some embodiments, after depositing the doped spacer and prior to selectively etching the core material, the substrate is annealed at a temperature less than about 400° C.

Depositing the doped spacer may include: exposing the substrate to a first dose of a silicon-containing precursor for a duration insufficient to saturate the surface of the substrate; exposing the substrate to a second dose of a dopant precursor for a duration insufficient to saturate the surface of the substrate to form a partially saturated surface of the silicon-containing precursor and the dopant on the surface of the substrate; and exposing the substrate to an oxidant to form a conformal doped silicon oxide material. In some embodiments the oxidant is any one of oxygen, carbon dioxide, water, nitrous oxide, and combinations thereof. Exposing the substrate to the oxidant may include flowing an inert gas selected from the group consisting of argon, nitrogen, and helium. In some embodiments, a process chamber housing the substrate is purged between performing (i) and (ii). In some embodiments, exposing the substrate to an oxidant includes introducing the oxidant and igniting a plasma.

The core material may be etched by exposing the substrate to a fluorocarbon gas and igniting a plasma. The fluorocarbon gas may be any of $CF_4$, $CHF_3$, $CH_2F_2$, and $CH_3F$.

In some embodiments, the mask formed has a pitch less than about 50 nm.

The doped spacer may be deposited at a substrate temperature between about 50° C. and about 200° C.

In some embodiments, the doped spacer includes a germanium-containing material deposited by depositing one or more layers of germanium oxide and the doped spacer is doped with phosphorous or argon.

The doped spacer may be deposited to a thickness between 50 Å and 300 Å. In some embodiments, the core material includes carbon.

The doped spacer may have a dopant density between about 1E20 at/cc and about 2E22 at/cc.

The dopant may be boron and depositing the one or more layers of the dopant oxide may include exposing the substrate to a dopant precursor such as any one of TMB (trimethylborate), TEB (triethylborate), $B_2H_6$ (diborane), trimethylborane, triethylborane, and combinations thereof.

The dopant may be phosphorous and depositing the one or more layers of the dopant oxide may include exposing the substrate to a dopant precursor such as any one of triethyl phosphate (TEPO) ($PO(OC_2H_5)_3$); trimethyl phosphate (TMPO) ($PO(OCH_3)_3$); trimethyl phosphite (TMPi) ($P(OCH_3)_3$); trisdimethylaminophosphorus (TDMAP) ($((CH_3)_2N)_3P$); phosphorous trichloride ($PCl_3$); trimethylsilyl phosphine (TMSP) ($P(Si(CH_3)_3)_3$); and phosphorus oxychloride ($POCl_3$).

Another aspect involves an apparatus for patterning substrates, the apparatus including: one or more process chambers; one or more gas inlets into the one or more process chambers and associated flow-control hardware; a low frequency radio frequency (LFRF) generator; a high frequency radio frequency (HFRF) generator; and a controller having at least one processor and a memory, whereby the at least one processor and the memory are communicatively connected with one another, the at least one processor is at least operatively connected with the flow-control hardware, the LFRF generator, and the HFRF generator, and the memory stores computer-executable instructions for controlling the at least one processor to at least control the flow-control hardware, the HFRF generator, and the LFRF generator to: deposit over a core material one or more layers of silicon oxide and deposit one or more layers of a dopant oxide selected from the group consisting of boron oxide, gallium oxide, phosphorous oxide, aluminum oxide, and arsenic oxide to form a doped spacer material; and etching the core material selective to the doped spacer material at an etch rate of the core material being between about 5 and about 20 times faster than the etch rate of the doped spacer material to form a mask; and etching a target layer using the mask.

Another aspect involves an apparatus for patterning substrates, the apparatus including: one or more process chambers; one or more gas inlets into the one or more process chambers and associated flow-control hardware; a low frequency radio frequency (LFRF) generator; a high frequency radio frequency (HFRF) generator; and a controller having at least one processor and a memory, whereby the at least one processor and the memory are communicatively connected with one another, the at least one processor is at least operatively connected with the flow-control hardware, the LFRF generator, and the HFRF generator, and the memory stores computer-executable instructions for controlling the at least one processor to at least control the flow-control hardware, the HFRF generator, and the LFRF generator to: deposit over a core material a doped spacer material by: introducing a first dose of a silicon-containing precursor for a duration insufficient to saturate the surface of the substrate; introducing a second dose of a dopant precursor for a duration insufficient to saturate the surface of the substrate to form a partially saturated surface of the silicon-containing precursor and the dopant on the surface of the substrate; and introducing an oxidant to form a doped spacer material; and etching the core material selective to the doped spacer material at an etch rate of the core material being between about 5 and about 20 times faster than the etch rate of the doped spacer material to form a mask; and etching a target layer using the mask.

These and other aspects are described further below with reference to the drawings.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

The implementations disclosed below describe deposition of a material on a substrate such as a wafer, substrate, or other work piece. The work piece may be of various shapes, sizes, and materials. In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon.

Patterning methods are used in many semiconductor manufacturing processes. In particular, double patterning has been used to extend lithographic technology beyond its optical limits. Double patterning is a one example technology to extend lithographic technology beyond its optical limits and is now widely used in the industry for any pitches less than about 80 nm. Current double patterning technologies often use sidewall spacers with two masking steps to pattern trenches. Methods of double patterning, particularly line patterning, in both positive and negative double patterning processes, have involved the use of spacers and masks. For example, in FIGS. 1A-1F, a substrate 100 as shown for a positive double patterning scheme. However, in FIGS. 1A-1F, poor etch selectivity between the core material and spacer material results in a poor, unstable, and weak mask and thereby resulting in a poorly etched target layer.

Figure 1A:
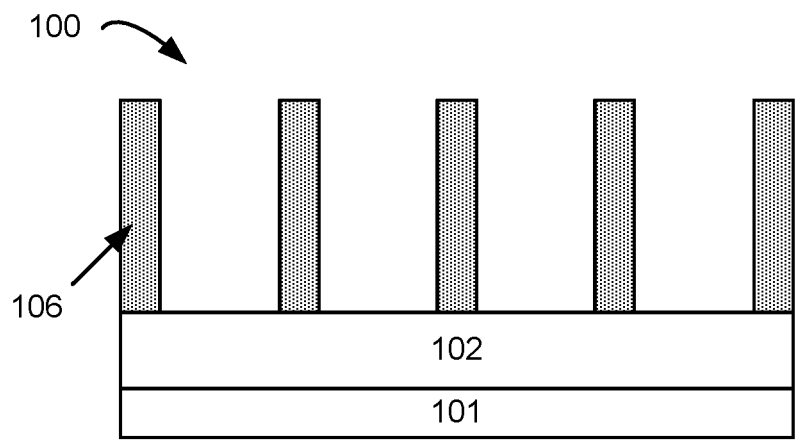
FIGS. 1A-1F are schematic illustrations of a substrate subject to a positive self-aligned double patterning scheme.
Figure 1B:
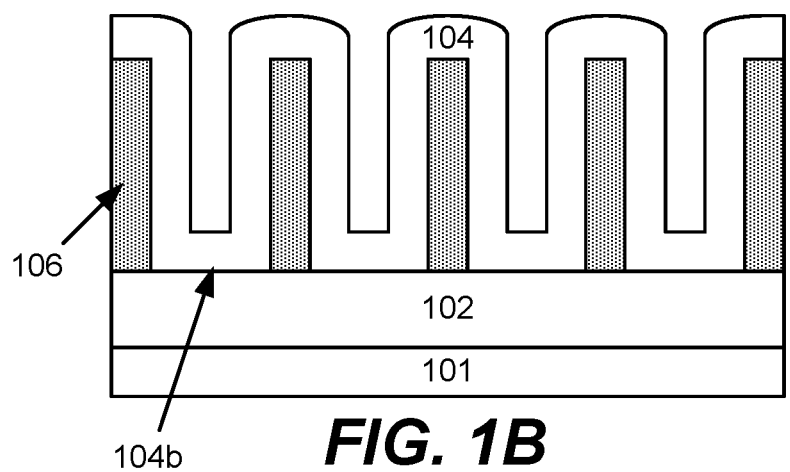
Figure 1C:
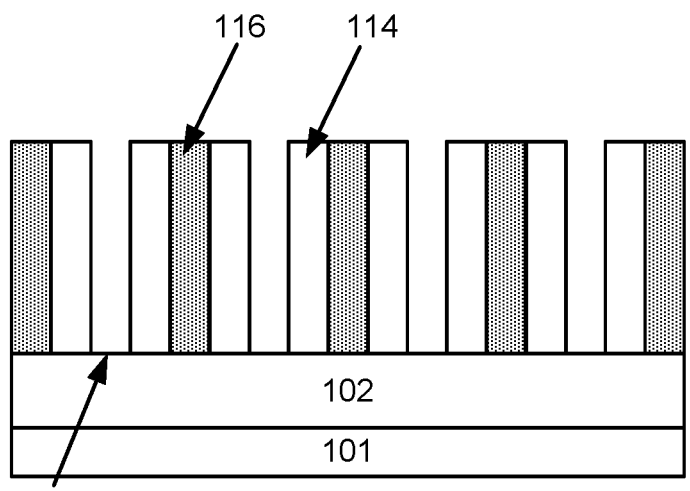
Figure 1D:
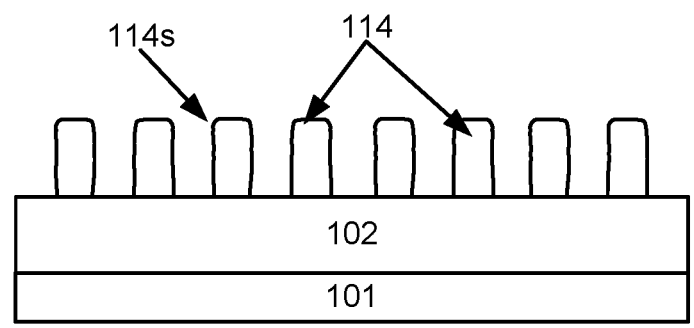
Figure 1E:
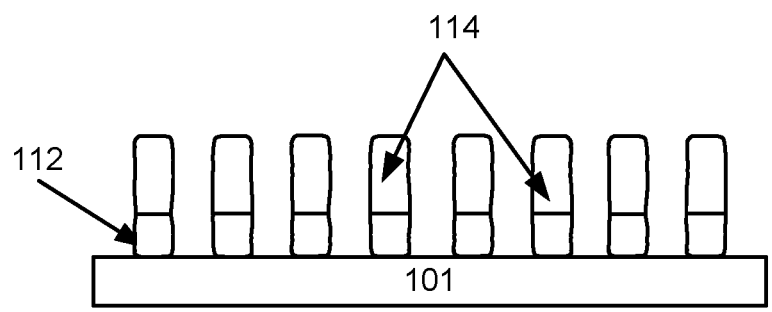
Figure 1F:
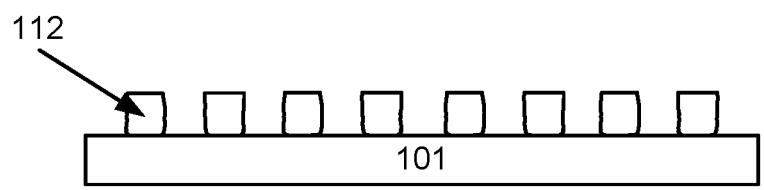
Figure 2:
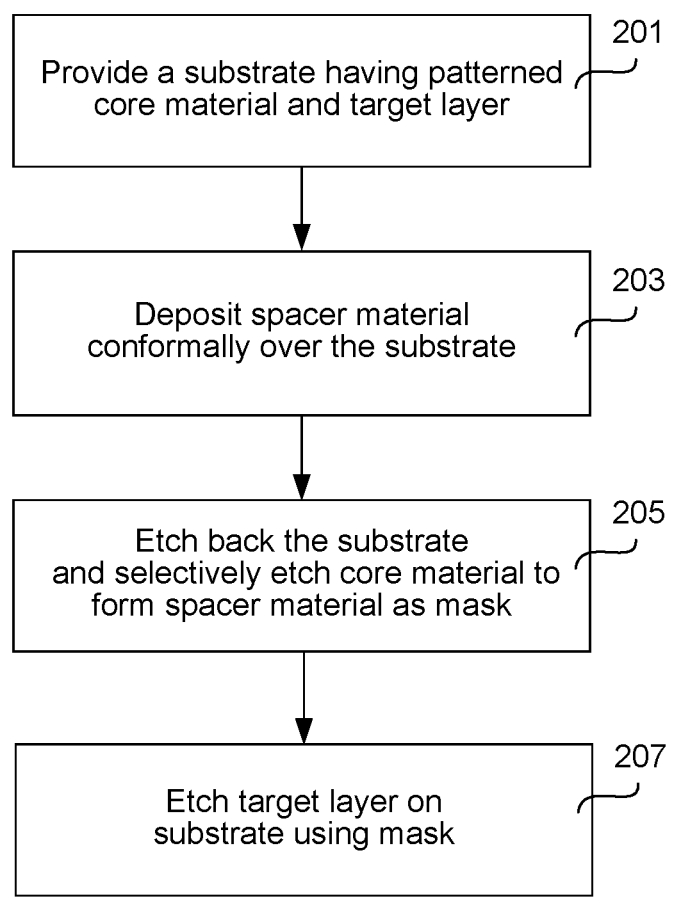
FIG. 2 is a process flow diagram depicting operations for a patterning scheme in accordance with certain disclosed embodiments.

FIG. 2 provides a process flow diagram of an overall positive double patterning scheme. FIGS. 1A-1F and 2 will be discussed together.

Referring to FIG. 2, in operation 201, a substrate having a patterned core material and a target layer is provided. FIG. 1A provides an example of such a substrate 100 having an underlayer 101, a target layer 102, and patterned core material 106.

Referring to FIG. 2, in operation 203, a spacer material is deposited conformally over the substrate. FIG. 1B shows a spacer material 104 deposited conformally over core material 106.

Referring to FIG. 2, in operation 205, the substrate is etched back and the core material selectively etched to form a mask made of the spacer material. Returning to FIG. 1C, the spacer material 114 is etched back to expose core material 116. Additionally, the spacer material 114 is directionally etched to remove spacer material 114 at the bottoms 108. In FIG. 1D, core material 116 is etched selective to the spacer material 114 using a dry etch chemistry. However, due to the poor etch selectivity of core material to conventional spacer material, etching results in an uneven etched spacer material 114, such as shown along the sidewalls 114s. FIG. 1D shows spacer material 114 as a mask used for subsequent etching. Note the quality of the spacer material 114 is degraded due to the poor etch selectivity for removing the core material 116 relative to the spacer material 114.

Returning to FIG. 2, in operation 207, the target layer on the substrate is etched using the mask. In FIG. 1E, the spacer material 114 is used as a mask to etch target layer 102, resulting in a poorly patterned target layer 112. The mask may be removed in FIG. 1F to leave the remaining patterned target layer 112 on the substrate over the underlayer 101. Note that because the mask used to pattern the target layer was degraded, unstable, and weak, the pattern of the resulting target layer 112 has poor quality. Current methods provide poor, unstable, and weak masks that are unable to provide effective formation of high aspect ratio features in semiconductors.

As the node shrinks for desired pattern, a higher selectivity of a freestanding spacer when the core material is etched using a dry etch sequence is desired. Some techniques have been employed to selectively etch core material. One technique involves using a different spacer material such as a high modulus titanium oxide material. However, using new spacer material involves the implementation of new deposition hardware and new etch chemistries which may be expensive, therefore increasing the overall cost of manufacturing. Further, metal oxide spacers use different core materials, such as amorphous silicon. This poses an integration hurdle since amorphous silicon etch profiles are more difficult to obtain. Thus, silicon oxide is often used for spacer materials because of its low cost of operation and ease of processing. Further, spacer materials are selected depending on the by-product formed when etched. For example, etching a titanium-containing spacer material using a fluorine-containing etch chemistry results in formation of titanium fluoride, which is a solid at 50° C., and thus involves heating hardware to remove the by-product material from chamber surfaces. In contrast, a doped spacer material as used in certain disclosed embodiments such as boron-doped or phosphorous-doped spacer material is capable of forming a volatile fluoride which is compatible with existing cleaning hardware.

Another technique is modulating temperature or plasma energy during the reaction for depositing the spacer material to achieve a higher film density, thereby decreasing the dry etch rate and improving the etch selectivity of core material to spacer material. However, using a high plasma or high temperature to form a silicon oxide spacer material may cause damage to a sensitive core material. For example, higher temperature increases the roughness at the core-oxide interface and higher plasma energy would result in higher plasma density that can ash the core material, leading to severe pattern collapse issues or increased line edge roughness.

Provided herein are methods and apparatuses for patterning a substrate using positive patterning schemes with doped spacer material having a low dry etch rate relative to core material. Methods involve doping silicon oxide and/or germanium oxide films as spacer materials in double patterning for quad patterning schemes. Example dopants include boron, gallium, phosphorus, arsenic, aluminum, and hafnium. Methods also involve forming nanolaminates of $DxOy/SiO_2$ by ALD, where D is any of the following dopants or any combination thereof: boron, gallium, phosphorus, arsenic, aluminum, and hafnium. The values x and y in DxOy depend on the dopant D used. For example, in some embodiments, for boron oxide, x may be 2 and y may be 3 for $B_2O_3$. In some embodiments, metallic dopants such as aluminum may be used such that an aluminate or aluminum-doped silicate is formed. Aluminates and aluminum-doped silicates may be used with carbon-containing core material (while titanium oxide spacer materials are compatible with amorphous silicon core material as described above). In various embodiments, a non-titanium metallic dopant may be used. Generally, the x:y ratio may be any of 1:1, 1:2, 1:3, 2:3, and 3:4. It will be understood that nanolaminates of "$DxOy/SiO_2$" constitute material including both DxOy and $SiO_2$. Some embodiments may involve annealing the substrate after depositing the doped spacer material to increase concentration of the dopant, increase the film quality, increase the film density, and/or permit the dopant to be more evenly distributed within the spacer material and thereby form a homogeneous doped spacer material. Disclosed embodiments increase etch selectivity by at least about 15% to 20% relative to conventionally deposited silicon oxide films used as spacer material over carbon-containing core material. For example, etch selectivity of core material to doped spacer material deposited using various disclosed embodiments may be at least about 5:1.

It will be understood that a doped spacers may include dopant driven into spacer material as well as alternating layers of dopant oxide and spacer oxide material. It will further be understood that a dopant driven into a spacer material may be a species chemically related to a dopant precursor or dopant source used for depositing layers of dopant oxide and/or used for adsorbing in sub-saturated doses onto the substrate in accordance with various disclosed embodiments. For example, the dopant precursor may be a phosphorus containing compound, and the dopant itself may be the phosphorous atom within the phosphorous containing compound.

Figure 3:
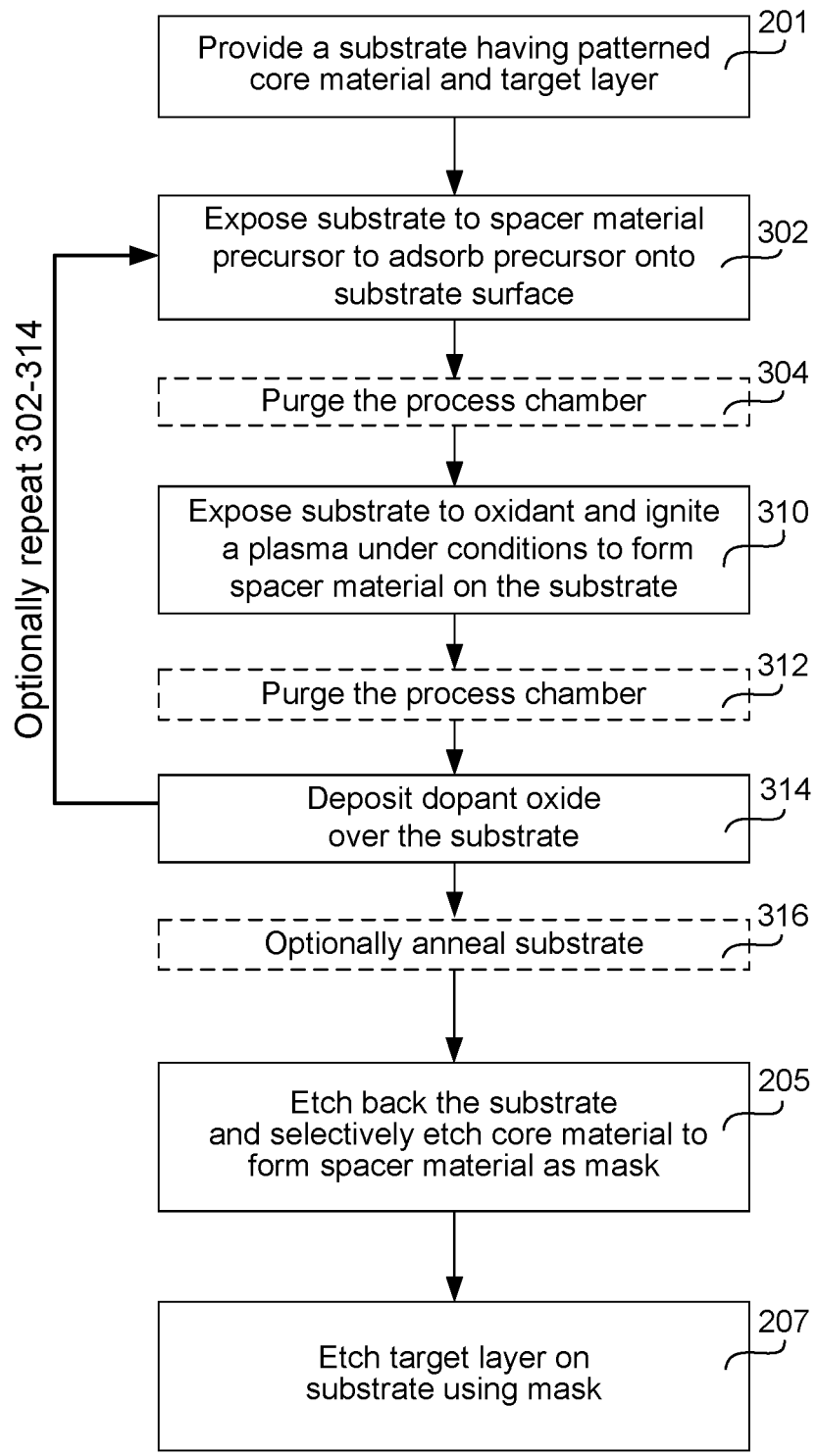
FIGS. 3 and 4 are process flow diagrams depicting operations for methods in accordance with certain disclosed embodiments.
Figure 4:
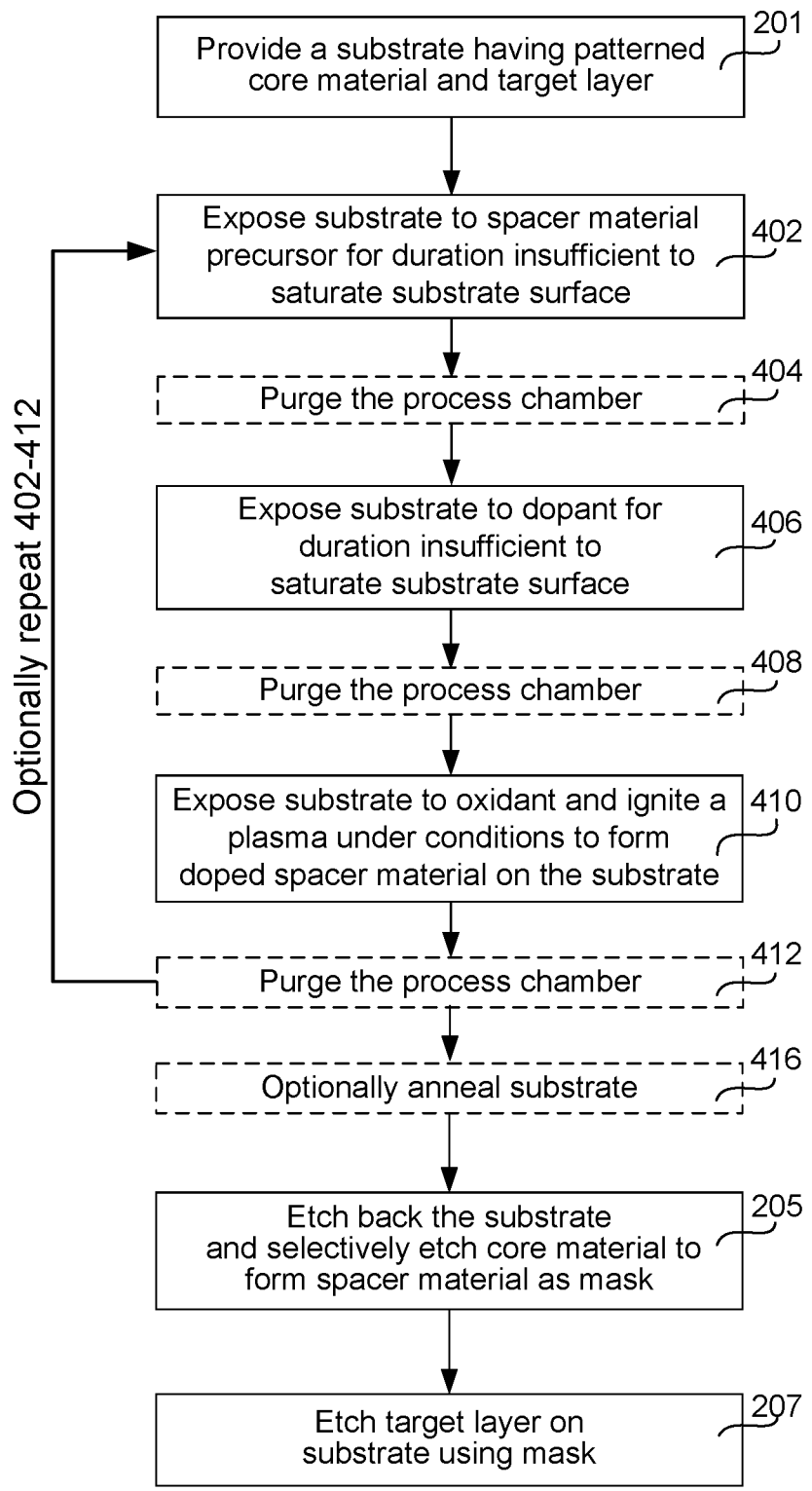

FIGS. 3 and 4 provide process flow diagrams for performing methods in accordance with certain disclosed embodiments. FIG. 3 provides a process flow diagram for performing a method involving forming a doped spacer over a core material by depositing alternating layers of spacer material and dopant oxide material. FIG. 4 provides a process flow diagram for forming a doped spacer over a core material by performing a co-deposition method involving depositing doped spacer material by sub-saturating a substrate with a spacer material precursor (e.g., silicon-containing precursor or germanium-containing precursor) and sub-saturating the substrate with a dopant precursor to form an adsorbed layer including both the spacer material precursor and the dopant precursor, followed by introducing an oxidant to form doped spacer material. Methods of depositing doped silicon oxide using ALD are further described in U.S. Pat. No. 8,956,983 issued on Feb. 17, 2015, entitled "CONFORMAL DOPING VIA PLASMA ACTIVATED ATOMIC LAYER DEPOSITION AND CONFORMAL FILM DEPOSITION," which is herein incorporated by reference in its entirety and for all purposes.

It will be understood that operations performed in FIGS. 3 and 4 are performed in a patterning scheme such as shown in FIG. 2. Operations 201 and 205 of FIG. 2 are included in FIGS. 3 and 4, but it will be understood that these operations may vary depending on the patterning scheme used. For example, a double patterning scheme and quad patterning scheme may have different and/or additional operations.

Referring to FIG. 3, in operation 201, a substrate having patterned core material over a target layer is provided. In various embodiments, the substrate is a semiconductor substrate. The substrate may be a silicon wafer, e.g., a 200-mm wafer, a 300-mm wafer, or a 450-mm wafer, including wafers having one or more layers of material, such as dielectric, conducting, or semi-conducting material deposited thereon.

The substrate may include a patterned core material. The core material may be a photoresist or may be made of amorphous carbon material or amorphous silicon material. In some embodiments, the core material may be transparent. The core material may be deposited by a deposition technique, such as plasma-enhanced chemical vapor deposition (PECVD), and the deposition technique may involve generating a plasma in the deposition chamber from deposition gases including a hydrocarbon precursor. The hydrocarbon precursor may be defined by the formula $C_aH_b$, where a is an integer between 2 and 10, and b is an integer between 2 and 24. Examples include methane ($CH_4$), acetylene ($C_2H_2$), ethylene ($C_2H_4$), propylene ($C_3H_6$), butane ($C_4H_{10}$), cyclohexane ($C_6H_{12}$), benzene ($C_6H_6$), and toluene ($C_7H_8$). A dual radio frequency (RF) plasma source including a high frequency (HF) power and a low frequency (LF) power may be used. The core material is deposited over a target layer prior to being patterned.

Figure 5A:
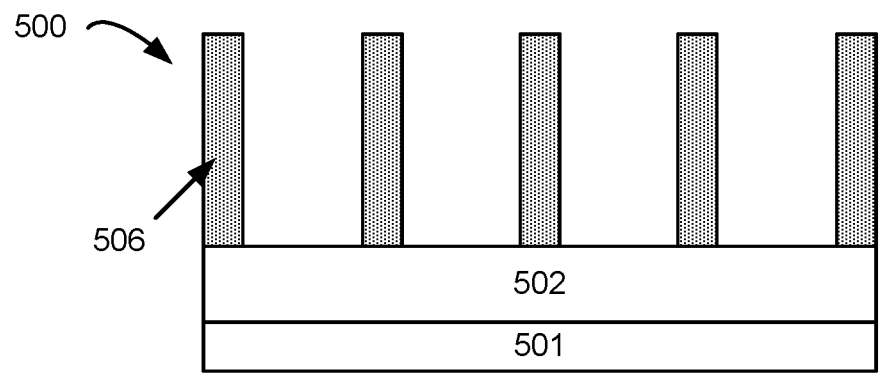
FIGS. 5A-5F are schematic illustrations of the substrate subject to a positive self-aligned double patterning scheme in accordance with certain disclosed embodiments.

The target layer may be the layer ultimately to be patterned. The target layer may be a semiconductor, dielectric, or other layer and may be made of silicon (Si), silicon oxide ($SiO_2$), silicon nitride (SiN), or titanium nitride (TiN), for example. The target layer may be deposited by ALD, plasma-enhanced ALD (PEALD), chemical vapor deposition (CVD), or other suitable deposition technique. FIG. 5A shows an example of a substrate 500 including a target layer 502 and a patterned core material 506.

Operations 302-312 may be performed at a temperature between about 50° C. and about 200° C., and at a pressure between about 1.0 Torr and about 9.0 Torr. Methods described herein may involve ALD. For example, in FIG. 3, operations 302-312 may constitute one cycle of ALD. ALD is a technique that deposits thin layers of material using sequential self-limiting reactions. ALD processes use surface-mediated deposition reactions to deposit films on a layer-by-layer basis in cycles. As an example, an ALD cycle may include the following operations: (i) delivery/adsorption of a precursor, (ii) purging of precursor from the chamber, (iii) delivery of a second reactant and optionally ignite plasma, and (iv) purging of byproducts from the chamber. The reaction between the second reactant and the adsorbed precursor to form a film on the surface of a substrate affects the film composition and properties, such as nonuniformity, stress, wet etch rate, dry etch rate, electrical properties (e.g., breakdown voltage and leakage current), etc.

In one example of an ALD process, a substrate surface that includes a population of surface active sites is exposed to a gas phase distribution of a first precursor, such as a silicon-containing precursor, in a dose provided to a chamber housing a substrate. Molecules of this first precursor are adsorbed onto the substrate surface, including chemisorbed species and/or physisorbed molecules of the first precursor. It should be understood that when a compound is adsorbed onto the substrate surface as described herein, the adsorbed layer may include the compound as well as derivatives of the compound. For example, an adsorbed layer of a silicon-containing precursor may include the silicon-containing precursor as well as derivatives of the silicon-containing precursor. After a first precursor dose, the chamber is then evacuated to remove most or all of first precursor remaining in gas phase so that mostly or only the adsorbed species remain. In some implementations, the chamber may not be fully evacuated. For example, the reactor may be evacuated such that the partial pressure of the first precursor in gas phase is sufficiently low to mitigate a reaction. A second reactant, such as an oxygen-containing gas, is introduced to the chamber so that some of these molecules react with the first precursor adsorbed on the surface. In some processes, the second precursor reacts immediately with the adsorbed first precursor. In other embodiments, the second reactant reacts only after a source of activation such as plasma is applied temporally. The chamber may then be evacuated again to remove unbound second reactant molecules. As described above, in some embodiments the chamber may not be completely evacuated. Additional ALD cycles may be used to build film thickness.

In some implementations, the ALD methods include plasma activation. As described herein, the ALD methods and apparatuses described herein may be conformal film deposition (CFD) methods, which are described generally in U.S. Pat. No. 8,728,956, filed Apr. 11, 2011, and titled "PLASMA ACTIVATED CONFORMAL FILM DEPOSITION," and in U.S. Patent Application Publication No. 2011/0256734, filed Apr. 11, 2011, and titled "SILICON NITRIDE FILMS AND METHODS," which are herein incorporated by reference in their entireties.

Referring to FIG. 3, in operation 302, the substrate is exposed to a spacer material precursor to adsorb the precursor onto the substrate surface. In some embodiments, the precursor may adsorb onto at least about 80% of the surface active sites. In some embodiments, the precursor may adsorb onto the substrate to fully saturate the surface of the substrate such that the precursor adsorbs onto the exposed surfaces of the core material and exposed regions of the target layer. The duration for exposing the substrate to the spacer material precursor may be between about 0.1 seconds and about 2 seconds.

The spacer material precursor is selected depending on the material used for the spacer. The spacer material may be silicon oxide or germanium oxide. For silicon oxide spacers, spacer material precursor may be a silicon-containing precursor. Silicon-containing precursors suitable for use in accordance with disclosed embodiments include polysilanes ($H_3Si$—$(SiH_2)_n$—$SiH_3$), where n≥0. Examples of silanes are silane ($SiH_4$), disilane ($Si_2H_6$), and organosilanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, and the like.

A halosilane includes at least one halogen group and may or may not include hydrogens and/or carbon groups. Examples of halosilanes are iodosilanes, bromosilanes, chlorosilanes and fluorosilanes. Although halosilanes, particularly fluorosilanes, may form reactive halide species that can etch silicon materials when a plasma is struck, a halosilane may not be introduced to the chamber when a plasma is struck in some embodiments, so formation of a reactive halide species from a halosilane may be mitigated. Specific chlorosilanes are tetrachlorosilane, trichlorosilane, dichlorosilane, monochlorosilane, chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like.

An aminosilane includes at least one nitrogen atom bonded to a silicon atom, but may also contain hydrogens, oxygens, halogens, and carbons. Examples of aminosilanes are mono-, di-, tri- and tetra-aminosilane ($H_3Si(NH_2)$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bi(tertiarybutylamino)silane ($SiH_2(NHC(CH_3)_3)_2$ (BTBAS), tert-butyl silylcarbamate, $SiH(CH_3)$—$(N(CH_3)_2)_2$, $SiHCl$—$(N(CH_3)_2)_2$, $(Si(CH_3)_2NH)_3$ and the like. A further example of an aminosilane is trisilylamine ($N(SiH_3)_3$).

In operation 304, a process chamber housing the substrate may be purged to remove precursors that are not adsorbed onto the substrate surface. Purging the chamber may involve flowing a purge gas or a sweep gas, which may be a carrier gas used in other operations or may be a different gas. In various embodiments, the purge gas is an inert gas. Example inert gases include argon, nitrogen, and helium. In some embodiments, purging may involve evacuating the chamber. Example purge gases include argon, nitrogen, hydrogen, and helium. In some embodiments, operation 304 may include one or more evacuation subphases for evacuating the process chamber. Alternatively, it will be appreciated that operation 304 may be omitted in some embodiments. Operation 304 may have any suitable duration, such as between about 0.1 seconds and about 2 seconds.

In operation 310, the substrate is exposed to an oxidant and a plasma is ignited under conditions to convert the adsorbed precursors to spacer material. For example, where silicon oxide spacer is being deposited, the silicon-containing precursor adsorbed onto the substrate surface reacts with the oxidizing plasma to form silicon oxide. Example oxidants include oxygen gas, water, carbon dioxide, nitrous oxide, and combinations thereof.

Plasma energy is provided to activate the second reactant, such as an oxygen-containing gas, into ions and radicals and other activated species, which react with the adsorbed layer of the first precursor. For example, the plasma may directly or indirectly activate the oxygen-containing gas phase molecules to form oxygen radicals or ions.

Plasma conditions for forming spacer material on the substrate are selected depending on the type of oxidant used. In some embodiments, the plasma is ignited for a time between about 0.25 seconds and about 10 seconds.

In various embodiments, the plasma ignited may be a single or dual radio frequency plasma. Single frequency plasmas are typically, though not necessarily, high frequency (HF)-only, with dual frequency plasmas typically including a low frequency (LF) component as well. In various embodiments, the plasma is an in-situ plasma, such that the plasma is formed directly above the substrate surface in the chamber. The in-situ plasma may be ignited at a power per substrate area between about 0.2122 W/cm$^2$ and about 2.122 W/cm$^2$. For example, the power may range from about 200 W to about 6000 W, for a chamber processing four 300 mm wafers. For example, plasmas for ALD processes may be generated by applying a radio frequency (RF) field to a gas using two capacitively coupled plates. Ionization of the gas between plates by the RF field ignites the plasma, creating free electrons in the plasma discharge region. These electrons are accelerated by the RF field and may collide with gas phase reactant molecules. Collision of these electrons with reactant molecules may form radical species that participate in the deposition process. It will be appreciated that the RF field may be coupled via any suitable electrodes. In various embodiments, a high frequency plasma is used having a frequency of at least about 13.56 MHz, or at least about 27 MHz, or at least about 40 MHz, or at least about 60 MHz. In some embodiments, a microwave-based plasma may be used. Non-limiting examples of electrodes include process gas distribution showerheads and substrate support pedestals. It will be appreciated that plasmas for ALD processes may be formed by one or more suitable methods other than capacitive coupling of an RF field to a gas. In some embodiments, the plasma is a remote plasma, such that an oxidant is ignited in a remote plasma generator upstream of the chamber, then delivered to the chamber where the substrate is housed.

In operation 312, the process chamber may be purged to remove any excess byproducts from the reaction between the spacer material precursor and the oxidant, and remove excess oxidant that did not react with the spacer material precursor on the substrate surface. The process conditions for operation 312 may be any of those described above with respect to operation 304. In some embodiments, the chamber is purged using an inert gas flowed at a flow rate between about 5 slm and about 30 slm.

In operation 314, a dopant oxide is deposited over the substrate. It will be understood that in some embodiments, spacer material may be deposited before depositing dopant oxide, while in some embodiments, dopant oxide may be deposited before depositing spacer material. Dopant oxide is deposited using any suitable technique, including but not limited to atomic layer deposition, chemical vapor deposition, sputtering, and spin on methods. The dopant oxide deposited over the substrate may be any of boron oxide, phosphorous oxide, aluminum oxide, arsenic oxide, hafnium oxide, gallium oxide, and combinations thereof. Although embodiments described herein involve boron dopants and phosphorus dopants, it will be understood that suitable precursors for depositing any of the dopant oxide may be used.

For depositing a boron oxide, any of the following boron-containing precursors may be used: TMB (trimethylborate), TEB (triethylborate), B$_2$H$_6$ (diborane), trimethylborane, triethylborane, and combinations thereof. In another example, for depositing a phosphorous-doped silicon oxide film, a phosphorous precursor may be used, such as triethyl phosphate (TEPO) (PO(OC$_2$H$_5$)$_3$); trimethyl phosphate (TMPO) (PO(OCH$_3$)$_3$); trimethyl phosphite (TMPi) (P(OCH$_3$)$_3$); tris-dimethylaminophosphorus (TDMAP) (((CH$_3$)$_2$N)$_3$P); phosphorous trichloride (PCl$_3$); trimethylsilyl phosphine (TMSP) (P(Si(CH$_3$)$_3$)$_3$); and phosphorus oxychloride (POCl$_3$).

Dopant oxide deposited by ALD may involve exposing the substrate to a dopant precursor, optionally purging the process chamber, exposing the substrate to an oxidizing plasma, optionally purging the process chamber, and optionally repeating these operations. The substrate may be exposed to the dopant precursor for a dose time between about 0.1 seconds and about 5 seconds. Dopant precursor may be flowed with a carrier gas such as argon, whereby argon is flowed at a flow rate between about 200 sccm and about 5000 sccm. Purge operations may be performed for a duration between about 0.1 seconds and about 5 seconds. The substrate may be exposed to an oxidizing plasma for a duration between about 0.1 seconds and about 5 seconds. The plasma may be ignited at an RF power between about 200 W and about 6000 W for four substrates. Purging operations performed after exposing to an oxidizing plasma may be performed for a duration between about 0.1 seconds and about 5 seconds. Inert gas flow for purge operations may be between about 5 slm and about 30 slm for purge operations performed following exposure to an oxidizing plasma. Deposition of dopant oxide may be performed at a chamber pressure between about 1.0 Torr and about 9.0 Torr.

In various embodiments, alternating layers of the dopant oxide and spacer material may be deposited over the substrate such that operations 302-314 are optionally repeated. Any number of layers of spacer material may be deposited for every layer of dopant oxide. For example, the amount of dopant desired in a spacer material may be modulated by selecting the relative ratio of spacer material layers to dopant oxide layers. In some embodiments, one dopant oxide layer may be deposited by ALD for every about three to about five layers of silicon oxide deposited by PEALD.

In operation 316, the substrate may be optionally annealed. Annealing may be performed at a substrate temperature up to about 400° C., such as between about 150° C. and about 400° C. Annealing may rearrange molecules and the deposited material on the substrate including the spacer material dopant oxide such that the doped spacer material is generally homogenous. Generally homogenous may be defined as having dopants dispersed evenly throughout the spacer material. In some embodiments, the dopant may be deposited in the spacer material at a density between about 1E20 and about 5E22 at/cc, such as between about 8E21 to about 1.8E22 at/cc.

Operations 302-316 may be used to deposit a doped spacer having a thickness between about 50 Å and about 300 Å. Spacers deposited using disclosed embodiments may have an etch selectivity to carbon-containing core material of at least about 1:5, such as between about 1:5 and about 1:20. That is, the etch rate of the carbon-containing core material may be at least 5 times faster than the etch rate of the doped spacer. Etch selectivity of core material to doped spacer material may be between about 5:1 and about 20:1.

In operation 205, the substrate may be etched back and the core material selectively etched to form a mask made of the spacer. In operation 207, the spacer mask may be used to etch a target layer on the substrate. Disclosed embodiments may be used as part of a positive patterning scheme for self-aligned double patterning and self-aligned quad patterning schemes. Operations 205 and 207 may be performed using etch chemistries and techniques described above with respect to FIG. 2.

FIG. 4 provides an alternate method of forming doped spacer materials for use in accordance with certain disclosed embodiments. Operations 201, 205, and 207 correspond to operations 201, 205, and 207 as described above with respect to FIG. 2. It will be understood that etch chemistries used to etch back the substrate may be any conventional etch chemistry but that the doped spacer deposited in operations 402-416 increase the etch selectivity such that core material etches at least 5 times faster than spacer material.

Following operation 201, in operation 402, the substrate is exposed to a spacer material precursor for a duration insufficient to saturate the substrate surface with the spacer material precursor. The spacer material precursor is introduced to the substrate in a sub-saturated dose under conditions to form a sub-saturated layer of the spacer material precursor on the substrate surface. In some embodiments, the dose phase of an ALD cycle concludes before the precursor contacts the substrate to evenly saturate the surface. For example, the duration of exposure may be reduced in this operation. Typically, the precursor flow is turned off or diverted at this point, and only purge gas flows. By operating in this sub-saturation regime, the ALD process reduces the cycle time and increases throughput. However, because precursor adsorption is not saturation limited, the adsorbed precursor concentration may vary slightly across the substrate surface. Examples of ALD processes operating in the sub-saturation regime are provided in U.S. patent application Ser. No. 14/061,587, filed Oct. 23, 2013, titled "SUB-SATURATED ATOMIC LAYER DEPOSITION AND CONFORMAL FILM DEPOSITION," which is incorporated herein by reference in its entirety.

The spacer material precursor selected may be any of those described above with respect to operation 302 of FIG. 3.

In operation 404, the process chamber may be purged to remove excess precursor in gas phase. Operation 404 may involve any of the process conditions and purge gases described above with respect to operation 304 of FIG. 3.

In operation 406, the substrate is exposed to a dopant precursor for a sub-saturated dose to adsorb dopant precursor onto the substrate surface. During this operation, the dopant may adsorb onto active sites on the substrate surface that are not occupied by spacer material precursor. After such a dose, a mostly or fully saturated layer including both spacer material precursor and dopant is on the surface of the substrate. Note that while operations 402 and 406 are discussed in sequence herein, it will be understood that in some embodiments, operation 402 may be performed prior to operation 406, and in some embodiments, operation 406 may be performed prior to operation 402.

In operation 408, the process chamber may be purged to remove excess dopant in gas phase from the chamber. Purging process conditions and purge gases may be any of those described above with respect to operation 304 of FIG. 3. It will be understood that in some embodiments, purge gases and process conditions used for operation 408 may be different from that of operation 404. Further, in some embodiments, purge gases and process conditions used for operation 408 may be the same as that of operation 404.

In operation 410, the substrate is exposed to an oxidant and a plasma is ignited under conditions to form a doped spacer material on the substrate. The oxidant plasma reacts with both dopant precursors on the substrate surface and spacer material precursors on the substrate surface to form a doped spacer material over the substrate. For example, for depositing a boron-doped silicon oxide spacer, operation 410 may involve flowing oxygen gas and igniting a plasma to convert silicon-containing precursors and boron-containing precursors adsorbed onto the surface of the substrate to silicon oxide and boron oxide, thereby forming a boron-doped silicon oxide film.

In operation 412, the substrate may be optionally purged using any of the conditions and purge gases described above with respect to operation 304.

Operations 402-412 may be optionally repeated for any suitable number of cycles to deposited a doped spacer material having a desired thickness. In some embodiments, the dopant sub-saturated dose may not be performed in every cycle.

In operation 416, the substrate may be optionally annealed to form a more homogenous doped spacer. Annealing process conditions may be any of those described above with respect to operation 316 of FIG. 3.

In operation 205, the substrate may be etched back and the core material may be selectively etched to leave doped spacer material on the substrate as a mask. Operations 402-416 may be used to deposit a doped spacer having a thickness between about 50 Å and about 300 Å. Spacers deposited using disclosed embodiments may have an etch selectivity to carbon-containing core material of at least about 1:5, such as between about 1:5 and about 1:20. That is, the etch rate of the carbon-containing core material may be at least 5 times faster than the etch rate of the doped spacer. Etch selectivity of core material to doped spacer material may be between about 5:1 and about 20:1.

In operation 207, the target layer of the substrate may be etched using the doped spacer as a mask. Embodiments related to FIG. 4 may be used for positive patterning schemes such as those used in self-aligned double patterning and self-aligned quad patterning schemes.

FIGS. 5A-5F provide an example series of schematic illustrations of a substrate 500 undergoing various disclosed embodiments. FIG. 5A shows the substrate 500 having an underlayer 501, target layer 502, and a patterned core material 506. In various embodiments, the substrate shown in FIG. 5A may be the substrate provided in operation 201 as described above with respect to FIGS. 2, 3, and 4.

Figure 5B:
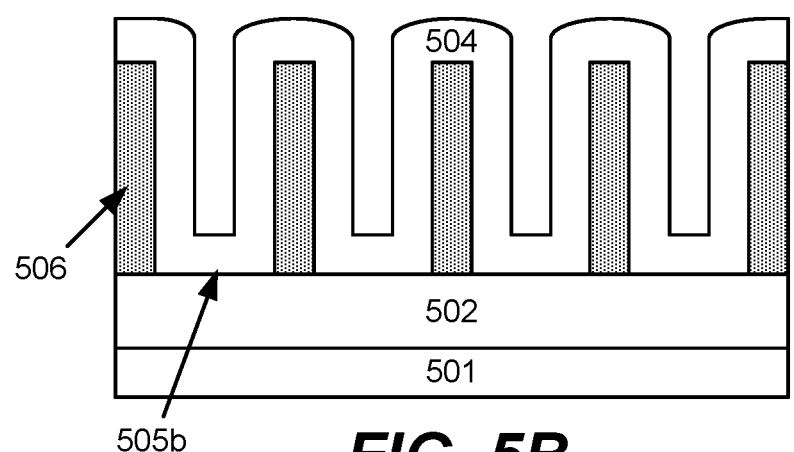

In FIG. 5B, a doped spacer material 504 is deposited conformally over the core material 506. Doped spacer material 504 may be deposited using alternate depositions of layers of spacer material and dopant oxide as described above with respect to FIG. 3. For example, doped spacer material 504 may be deposited by deposited one layer of boron oxide for every three layers of silicon oxide, where boron oxide and silicon oxide are both deposited using PEALD techniques. Alternatively, doped spacer material 504 may be deposited by performing sub-saturated doses of spacer material precursor and dopant precursor over the substrate to form an adsorbed layer of both spacer material precursor and dopant precursor, and reacting the adsorbed layer using an oxidant and plasma such as described above with respect to FIG. 4. For example, in some embodiments, a silicon-containing precursor may be sub-saturated onto the surface, and a boron-containing precursor may be sub-saturated onto the surface to form a silicon-containing precursor and boron-containing precursor adsorbed layer on the substrate surface. The adsorbed layer may then react with oxidizing plasma to form a boron-doped silicon oxide film. Such operations may then be repeated one or more times to form a thicker boron-doped silicon oxide spacer such as the doped spacer material 504 shown in FIG. 5B. Doped spacer material 504 may also be annealed to form a homogenous film.

Figure 5C:
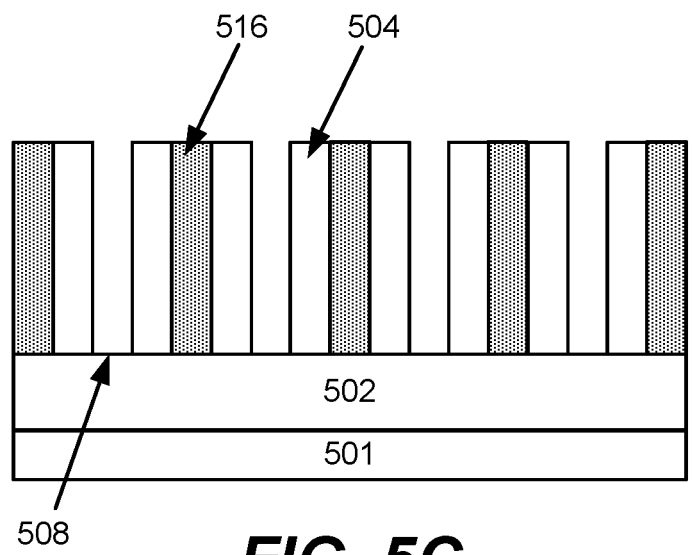

In FIG. 5C, the substrate is etched back, such as by chemical mechanical planarization (CMP) techniques, and the substrate may further be directionally etched to remove doped spacer material at 508. This etching operation is performed such that the integrity of the doped spacer material 504 is maintained and the etching is performed to open the spacer material and expose the core material 516 as shown in FIG. 5C. This operation may, in some embodiments, involve directional ion sputtering techniques or dry etching techniques using a fluorocarbon etch chemistry.

Figure 5D:
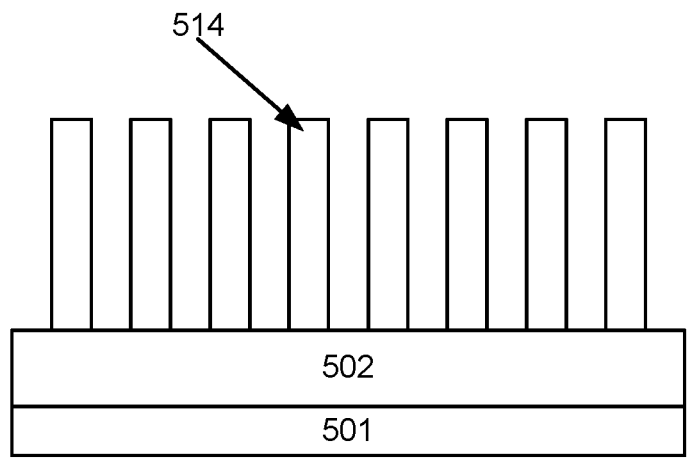

In operation 5D, the core material 516 from FIG. 5C is selectively etched to leave doped spacer material 514 remaining on the substrate as a mask. Core material 516 is etched at an etch rate at least 5 times faster than the etch rate of the doped spacer material 514. As compared to FIG. 5A, the substrate shown in FIG. 5D is prepared to be used to etch the target layer 502 as a self-aligned double patterning mask whereby the pitch is reduced by half. The improved etch selectivity maintains the smooth sidewalls of the spacer material 514 without degrading the spacer material 514.

Figure 5E:
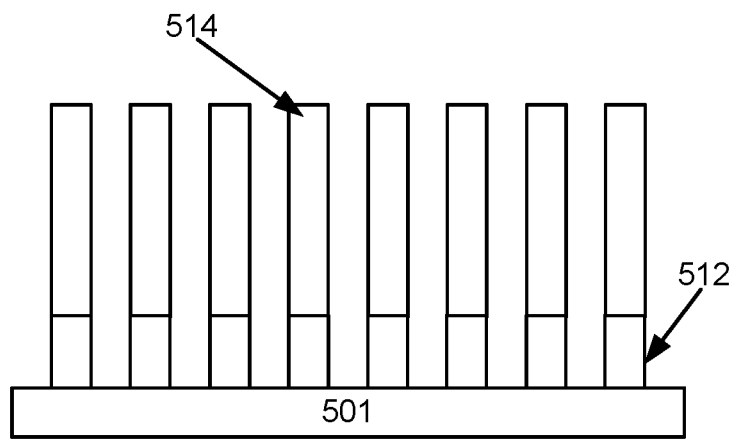

In FIG. 5E, target layer 512 is etched using the doped spacer material 514 as a mask. Because the etch selectivity of core material to doped spacer material is improved, the doped spacer material 514 used as a mask results in a high quality etch profile in the target layer 512.

Figure 5F:
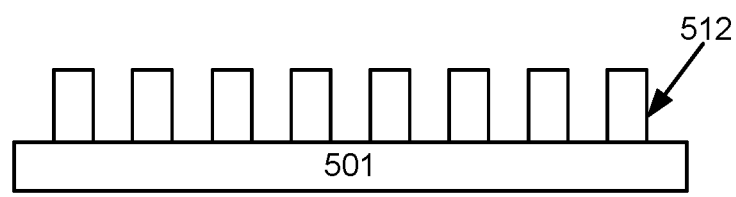

In FIG. 5F, the doped spacer material 514 is removed, leaving the etched target layer 512 on the substrate. As compared to FIG. 1F, the etched target layer 512 has a good etch profile.

It will be understood that etch rate and etch selectivity of carbon-containing materials to doped spacer material may be further modulated by changing the temperature of the substrate (e.g., the temperature at which the pedestal holding the substrate is set at), increasing the plasma power, and increasing inert gas flow such as argon gas flow to further reduce the etch rate of doped spacer material. Post-deposition anneals such as described herein may also be used to reduce the etch rate.

Figure 6:
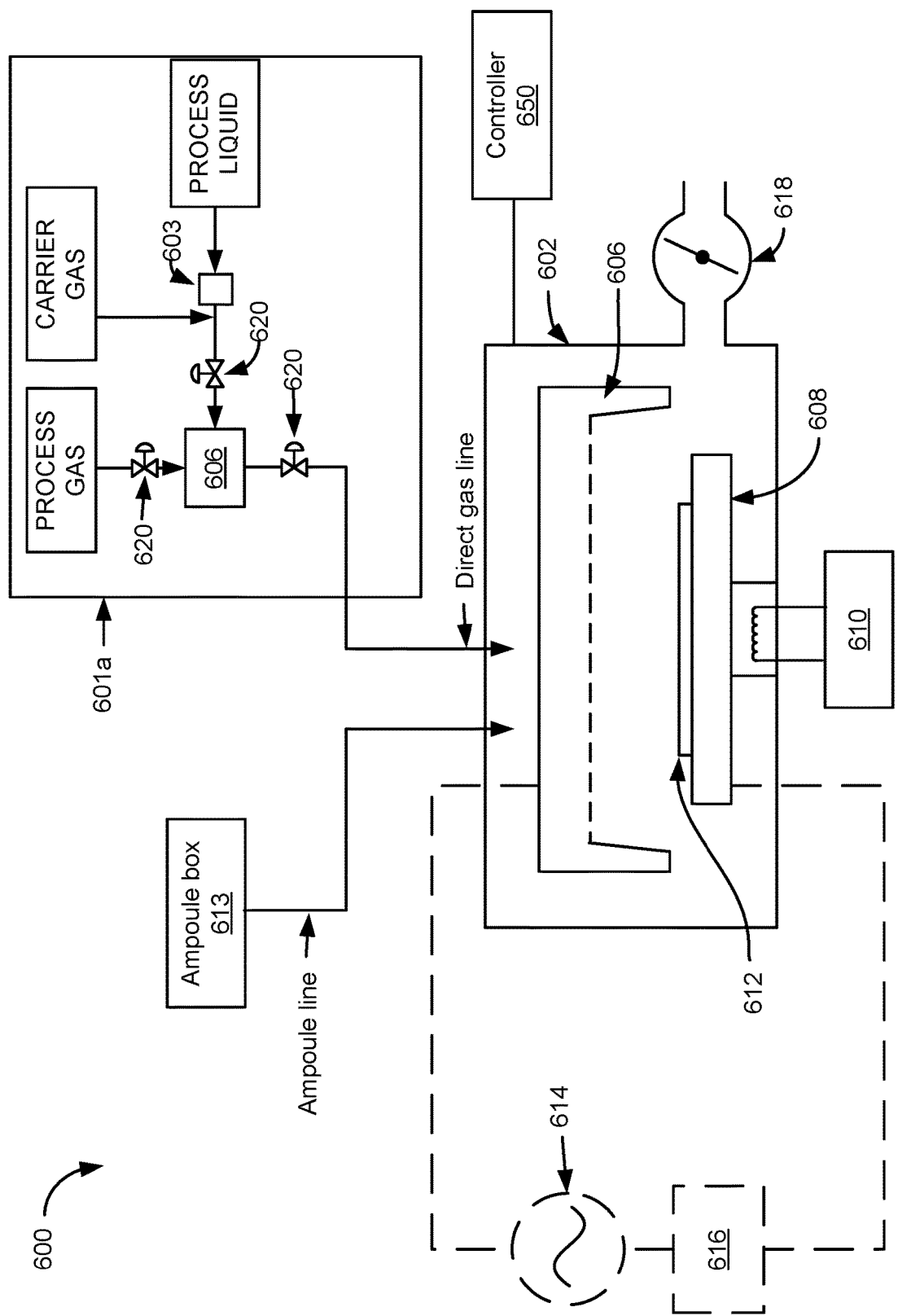
FIG. 6 is a schematic diagram of an example process chamber for performing certain disclosed embodiments.
Figure 7:
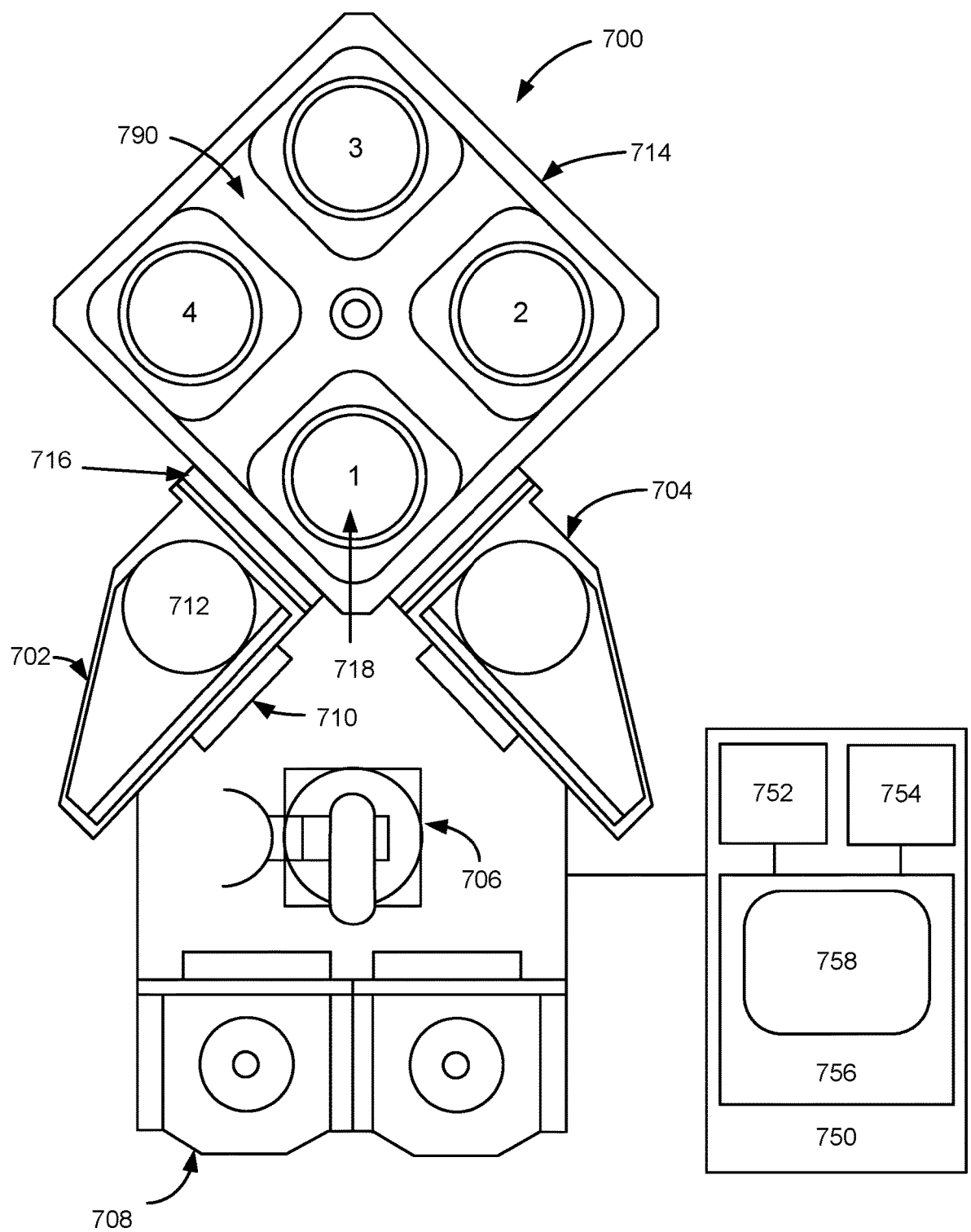
FIG. 7 is a schematic diagram of an example process tool for performing certain disclosed embodiments.

FIG. 6 depicts a schematic illustration of an embodiment of an atomic layer deposition (ALD) process station 600 having a process chamber body 602 for maintaining a low-pressure environment. A plurality of ALD process stations 600 may be included in a common low pressure process tool environment. For example, FIG. 7 depicts an embodiment of a multi-station processing tool 700. In some embodiments, one or more hardware parameters of ALD process station 600, including those discussed in detail below, may be adjusted programmatically by one or more computer controllers 650.

ALD process station 600 fluidly communicates with reactant delivery system 601a for delivering process gases to a distribution showerhead 606. Reactant delivery system 601a includes a mixing vessel 604 for blending and/or conditioning process gases, such as a silicon-containing precursor gas, dopant precursor gas, or oxidant gas, for delivery to showerhead 606. One or more mixing vessel inlet valves 620 may control introduction of process gases to mixing vessel 604. Disclosed embodiments for etching core material selective to doped spacer material may be performed in one or more process chambers. For example, while a doped spacer material may be deposited in a process chamber such as ALD process station 600, ALD process station 600 may be a part of a larger tool or apparatus such as described below with respect to FIGS. 7 and 9. Etching operations may be performed in a separate process chamber such as described below with respect to FIG. 8.

As an example, the embodiment of FIG. 6 includes a vaporization point 603 for vaporizing liquid reactant to be supplied to the mixing vessel 604. In some embodiments, vaporization point 603 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 603 may be heat traced. In some examples, mixing vessel 604 may also be heat traced. In one non-limiting example, piping downstream of vaporization point 603 has an increasing temperature profile extending from approximately 100° C. to approximately 150° C. at mixing vessel 604.

In some embodiments, liquid precursor or liquid reactant may be vaporized at a liquid injector. For example, a liquid injector may inject pulses of a liquid reactant into a carrier gas stream upstream of the mixing vessel. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 603. In one scenario, a liquid injector may be mounted directly to mixing vessel 604. In another scenario, a liquid injector may be mounted directly to showerhead 606.

In some embodiments, a liquid flow controller (LFC) upstream of vaporization point 603 may be provided for controlling a mass flow of liquid for vaporization and delivery to process station 600. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 606 distributes process gases toward substrate 612. In the embodiment shown in FIG. 6, the substrate 612 is located beneath showerhead 606 and is shown resting on a pedestal 608. Showerhead 606 may have any suitable shape, and may have any suitable number and arrangement of ports for distributing process gases to substrate 612.

In some embodiments, pedestal 608 may be raised or lowered to expose substrate 612 to a volume between the substrate 612 and the showerhead 606. It will be appreciated that, in some embodiments, pedestal height may be adjusted programmatically by a suitable computer controller 650.

In another scenario, adjusting a height of pedestal 608 may allow a plasma density to be varied during plasma activation cycles included in the process. At the conclusion of the process phase, pedestal 608 may be lowered during another substrate transfer phase to allow removal of substrate 612 from pedestal 608.

In some embodiments, a position of showerhead 606 may be adjusted relative to pedestal 608 to vary a volume between the substrate 612 and the showerhead 606. Further, it will be appreciated that a vertical position of pedestal 608 and/or showerhead 606 may be varied by any suitable mechanism within the scope of the present disclosure. In some embodiments, pedestal 608 may include a rotational axis for rotating an orientation of substrate 612. It will be appreciated that, in some embodiments, one or more of these example adjustments may be performed programmatically by one or more suitable computer controllers 650. The computer controller 650 may include any of the features described below with respect to controller 750 of FIG. 7.

In some embodiments where plasma may be used as discussed above, showerhead 606 and pedestal 608 electrically communicate with a radio frequency (RF) power supply 614 and matching network 616 for powering a plasma. In some embodiments, the plasma energy may be controlled by controlling one or more of a process station pressure, a gas concentration, an RF source power, an RF source frequency, and a plasma power pulse timing. For example, RF power supply 614 and matching network 616 may be operated at any suitable power to form a plasma having a desired composition of radical species. Examples of suitable powers are included above. Likewise, RF power supply 614 may provide RF power of any suitable frequency. In some embodiments, RF power supply 614 may be configured to control high- and low-frequency RF power sources independently of one another. Example low-frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than 40 MHz, or greater than 60 MHz. It will be appreciated that any suitable parameters may be modulated discretely or continuously to provide plasma energy for the surface reactions.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 650 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of a spacer material precursor gas, and instructions for modulating a flow rate of a carrier gas, and time delay instructions for the first recipe phase. A second recipe phase may include instructions for modulating or stopping a flow rate of a spacer material precursor gas, instructions for modulating the flow rate of a carrier or purge gas, and time delay instructions for the second recipe phase. A third recipe phase may include instructions for setting a flow rate of an inert and/or a reactant gas (e.g., an oxidant), instructions for setting a flow rate of a carrier gas (such as argon), and time delay instructions for the third recipe phase. A fourth, subsequent recipe phase may include instructions for modulating or stopping a flow rate of an inert and/or a reactant gas, and instructions for modulating a flow rate of a carrier or purge gas and time delay instructions for the fourth recipe phase. A fifth recipe phase may include instructions for modulating a flow rate of a dopant precursor gas such as a boron-containing precursor, instructions for modulating the flow rate of a carrier or purge gas, and time delay instructions for the fifth recipe phase. A sixth, subsequent recipe phase may include instructions for modulating or stopping a flow rate of an inert and/or a reactant gas, instructions for igniting a plasma, and instructions for modulating a flow rate of a carrier or purge gas and time delay instructions for the sixth recipe phase. It will be appreciated that these recipe phases may be further subdivided and/or iterated in any suitable way within the scope of the present disclosure. In some embodiments, recipe phases may be selected to introduce a sub-saturated dose of a spacer material precursor gas, introduce a sub-saturated dose of a dopant precursor gas, introduce an oxidant and ignite a plasma to form a doped spacer material.

In some embodiments, pedestal 608 may be temperature controlled via heater 610. In some embodiments, pedestal 608 may be modulated to heat a substrate to a temperature up to about 400° C. for annealing a substrate after depositing a doped spacer material. Further, in some embodiments, pressure control for process station 600 may be provided by butterfly valve 618. As shown in the embodiment of FIG. 6, butterfly valve 618 throttles a vacuum provided by a downstream vacuum pump (not shown). However, in some embodiments, pressure control of process station 600 may also be adjusted by varying a flow rate of one or more gases introduced to the process station 600.

As described above, one or more process stations may be included in a multi-station processing tool. FIG. 7 shows a schematic view of an embodiment of a multi-station processing tool 700 with an inbound load lock 702 and an outbound load lock 704, either or both of which may include a remote plasma source. A robot 706, at atmospheric pressure, is configured to move wafers from a cassette loaded through a pod 708 into inbound load lock 702 via an atmospheric port 710. A wafer is placed by the robot 706 on a pedestal 712 in the inbound load lock 702, the atmospheric port 710 is closed, and the load lock is pumped down. Where the inbound load lock 702 includes a remote plasma source, the wafer may be exposed to a remote plasma treatment in the load lock prior to being introduced into a processing chamber 714. Further, the wafer also may be heated in the inbound load lock 702 as well, for example, to remove moisture and adsorbed gases. Next, a chamber transport port 716 to processing chamber 714 is opened, and another robot (not shown) places the wafer into the reactor on a pedestal of a first station shown in the reactor for processing. While the embodiment depicted in FIG. 7 includes load locks, it will be appreciated that, in some embodiments, direct entry of a wafer into a process station may be provided.

The depicted processing chamber 714 includes four process stations, numbered from 1 to 4 in the embodiment shown in FIG. 7. Each station has a heated pedestal (shown at 718 for station 1), and gas line inlets. It will be appreciated that in some embodiments, each process station may have different or multiple purposes. For example, in some embodiments, a process station may be switchable between an ALD and plasma-enhanced ALD process mode. In some embodiments, a spacer material may be deposited in one process station and a layer of dopant oxide may be deposited in a second process station such that the substrate may be shuttled or moved between process stations for performing various disclosed embodiments. Additionally or alternatively, in some embodiments, processing chamber 714 may include one or more matched pairs of ALD and plasma-enhanced ALD process stations. While the depicted processing chamber 714 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 7 depicts an embodiment of a wafer handling system 790 for transferring wafers within processing chamber 714. In some embodiments, wafer handling system 790 may transfer wafers between various process stations and/or between a process station and a load lock. It will be appreciated that any suitable wafer handling system may be employed. Non-limiting examples include wafer carousels and wafer handling robots. FIG. 7 also depicts an embodiment of a system controller 750 employed to control process conditions and hardware states of process tool 700. System controller 750 may include one or more memory devices 756, one or more mass storage devices 754, and one or more processors 752. Processor 752 may include a CPU or computer, analog, and/or digital input/output connections, stepper motor controller boards, etc.

In some embodiments, system controller 750 controls all of the activities of process tool 700. System controller 750 executes system control software 758 stored in mass storage device 754, loaded into memory device 756, and executed on processor 752. Alternatively, the control logic may be hard coded in the controller 750. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 758 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 700. System control software 758 may be configured in any suitable way. For example, various process tool component subroutines or control objects may be written to control operation of the process tool components used to carry out various process tool processes. System control software 758 may be coded in any suitable computer readable programming language.

In some embodiments, system control software 758 may include input/output control (IOC) sequencing instructions for controlling the various parameters described above. Other computer software and/or programs stored on mass storage device 754 and/or memory device 756 associated with system controller 750 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 718 and to control the spacing between the substrate and other parts of process tool 700.

A process gas control program may include code for controlling gas composition (e.g., silicon-containing gases, oxygen-containing gases, boron-containing gases, phosphorous-containing gases, and purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 750. The user interface may include a display screen, graphical software displays of the apparatus and/or process conditions, and user input devices such as pointing devices, keyboards, touch screens, microphones, etc.

In some embodiments, parameters adjusted by system controller 750 may relate to process conditions. Non-limiting examples include process gas composition and flow rates, temperature, pressure, plasma conditions (such as RF bias power levels), pressure, temperature, etc. These parameters may be provided to the user in the form of a recipe, which may be entered utilizing the user interface.

Signals for monitoring the process may be provided by analog and/or digital input connections of system controller 750 from various process tool sensors. The signals for controlling the process may be output on the analog and digital output connections of process tool 700. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 750 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller 750 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 750.

In some implementations, the system controller 750 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 750, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 750 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 750 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 750, in some implementations, may be a part of or coupled to a computer that is integrated with, coupled to the system, otherwise networked to the system, or a combination thereof. For example, the system controller 750 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 750 receives instructions in the form of data, which specify parameters for each of the processing steps to be performed during one or more operations. It should be understood that the parameters may be specific to the type of process to be performed and the type of tool that the system controller 750 is configured to interface with or control. Thus as described above, the system controller 750 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 750 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

An appropriate apparatus for performing the methods disclosed herein is further discussed and described in U.S. patent application Ser. No. 13/084,399 (now U.S. Pat. No. 8,728,956), filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Etching operations described herein, such as for etching core material selective to the spacer material, may be performed in any suitable process chamber. In some embodiments, substrates may be etched in an inductively coupled plasma (ICP) reactor such as shown in FIG. 8.

Inductively coupled plasma (ICP) reactors which, in certain embodiments, may be suitable for etching operations and atomic layer deposition (ALD) operations are now described. Such ICP reactors have also described in U.S. Patent Application Publication No. 2014/0170853, filed Dec. 10, 2013, and titled "IMAGE REVERSAL WITH AHM GAP FILL FOR MULTIPLE PATTERNING," hereby incorporated by reference in its entirety and for all purposes. Although ICP reactors are described herein, in some embodiments, it should be understood that capacitively coupled plasma reactors may also be used.

Figure 8:
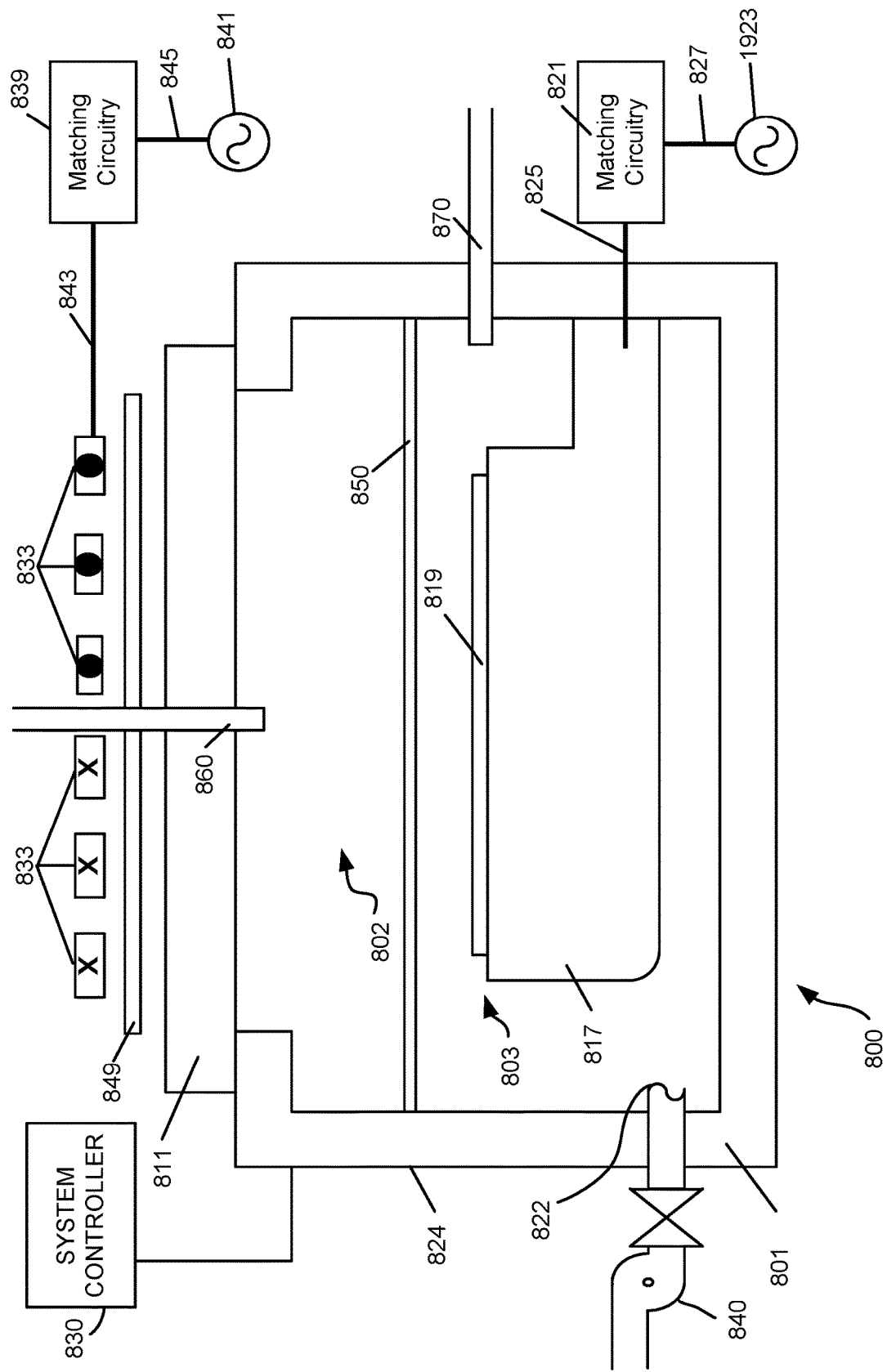
FIG. 8 is a schematic diagram of an example process chamber for performing certain disclosed embodiments.

FIG. 8 schematically shows a cross-sectional view of an inductively coupled plasma integrated etching and deposition apparatus 800 appropriate for implementing certain embodiments herein, an example of which is a Kiyo™ reactor, produced by Lam Research Corp. of Fremont, Calif. The inductively coupled plasma apparatus 800 includes an overall process chamber structurally defined by chamber walls 801 and a window 811. The chamber walls 801 may be fabricated from stainless steel or aluminum. The window 811 may be fabricated from quartz or other dielectric material. An optional internal plasma grid 850 divides the overall processing chamber into an upper sub-chamber 802 and a lower sub-chamber 803. In most embodiments, plasma grid 850 may be removed, thereby utilizing a chamber space made of sub-chambers 802 and 803. A chuck 817 is positioned within the lower sub-chamber 803 near the bottom inner surface. The chuck 817 is configured to receive and hold a semiconductor wafer 819 upon which the etching and deposition processes are performed. The chuck 817 can be an electrostatic chuck for supporting the wafer 819 when present. In some embodiments, an edge ring (not shown) surrounds chuck 817, and has an upper surface that is approximately planar with a top surface of a wafer 819, when present over chuck 817. The chuck 817 also includes electrostatic electrodes for chucking and dechucking the wafer. A filter and DC clamp power supply (not shown) may be provided for this purpose. Other control systems for lifting the wafer 819 off the chuck 817 can also be provided. The chuck 817 can be electrically charged using an RF power supply 823. The RF power supply 823 is connected to matching circuitry 821 through a connection 827. The matching circuitry 821 is connected to the chuck 817 through a connection 825. In this manner, the RF power supply 823 is connected to the chuck 817.

Elements for plasma generation include a coil 833 is positioned above window 811. In some embodiments, a coil is not used in disclosed embodiments. The coil 833 is fabricated from an electrically conductive material and includes at least one complete turn. The example of a coil 833 shown in FIG. 8 includes three turns. The cross-sections of coil 833 are shown with symbols, and coils having an "X" extend rotationally into the page, while coils having a "●" extend rotationally out of the page. Elements for plasma generation also include an RF power supply 841 configured to supply RF power to the coil 833. In general, the RF power supply 841 is connected to matching circuitry 839 through a connection 845. The matching circuitry 839 is connected to the coil 833 through a connection 843. In this manner, the RF power supply 841 is connected to the coil 833. An optional Faraday shield 849 is positioned between the coil 833 and the window 811. The Faraday shield 849 is maintained in a spaced apart relationship relative to the coil 833. The Faraday shield 849 is disposed immediately above the window 811. The coil 833, the Faraday shield 849, and the window 811 are each configured to be substantially parallel to one another. The Faraday shield may prevent metal or other species from depositing on the dielectric window of the plasma chamber.

Process gases (e.g. argon, fluorocarbons such as $C_aF_b$, etc.) may be flowed into the process chamber 824 through one or more main gas flow inlets 860 positioned in the upper chamber and/or through one or more side gas flow inlets 870. Likewise, though not explicitly shown, similar gas flow inlets may be used to supply process gases to a capacitively coupled plasma process chamber 824. A vacuum pump, e.g., a one or two stage mechanical dry pump and/or turbomolecular pump 840, may be used to draw process gases out of the process chamber 824 and to maintain a pressure within the process chamber 824. For example, the pump may be used to evacuate the process chamber 824 during a purge operation of ALD. A valve-controlled conduit may be used to fluidically connect the vacuum pump to the process chamber 824 so as to selectively control application of the vacuum environment provided by the vacuum pump. This may be done employing a closed-loop-controlled flow restriction device, such as a throttle valve (not shown) or a pendulum valve (not shown), during operational plasma processing. Likewise, a vacuum pump and valve controlled fluidic connection to the capacitively coupled plasma process chamber 824 may also be employed.

During operation of the apparatus, one or more process gases may be supplied through the gas flow inlets 860 and/or 870. In certain embodiments, process gas may be supplied only through the main gas flow inlet 860, or only through the side gas flow inlet 870. In some cases, the gas flow inlets shown in the figure may be replaced more complex gas flow inlets, one or more showerheads, for example. The Faraday shield 849 and/or optional grid 850 may include internal channels and holes that allow delivery of process gases to the process chamber 824. Either or both of Faraday shield 849 and optional grid 850 may serve as a showerhead for delivery of process gases. In some embodiments, a liquid vaporization and delivery system may be situated upstream of the chamber 824, such that once a liquid reactant is vaporized, the vaporized reactant is introduced into the process chamber 824 via a gas flow inlet 860 and/or 870.

Radio frequency power is supplied from the RF power supply 841 to the coil 833 to cause an RF current to flow through the coil 833. The RF current flowing through the coil 833 generates an electromagnetic field about the coil 833. The electromagnetic field generates an inductive current within the upper sub-chamber 802. The physical and chemical interactions of various generated ions and radicals with the wafer 819 selectively etch features of and deposit layers on the wafer.

If the plasma grid is used such that there is both an upper sub-chamber 802 and a lower sub-chamber 803, the inductive current acts on the gas present in the upper sub-chamber 802 to generate an electron-ion plasma in the upper sub-chamber 802. The optional internal plasma grid 850 limits the amount of hot electrons in the lower sub-chamber 803. In some embodiments, the apparatus is designed and operated such that the plasma present in the lower sub-chamber 803 is an ion-ion plasma.

Both the upper electron-ion plasma and the lower ion-ion plasma may contain positive and negative ions, though the ion-ion plasma will have a greater ratio of negative ions to positive ions. Volatile etching and/or deposition byproducts may be removed from the lower-sub-chamber 803 through port 822. The chuck 817 disclosed herein may operate at elevated temperatures ranging between about 10° C. and about 850° C. The temperature will depend on the process operation and specific recipe.

Process chamber 824 may be coupled to facilities (not shown) when installed in a clean room or a fabrication facility. Facilities include plumbing that provide processing gases, vacuum, temperature control, and environmental particle control. These facilities are coupled to process chamber 824, when installed in the target fabrication facility. Additionally, process chamber 824 may be coupled to a transfer chamber (not shown) that allows robotics to transfer semiconductor wafers into and out of process chamber 824 using typical automation.

In some embodiments, a system controller 830 (which may include one or more physical or logical controllers) controls some or all of the operations of a process chamber 824. The system controller 830 may include any one or more characteristics described above with respect to computer controller 650.

Figure 9:
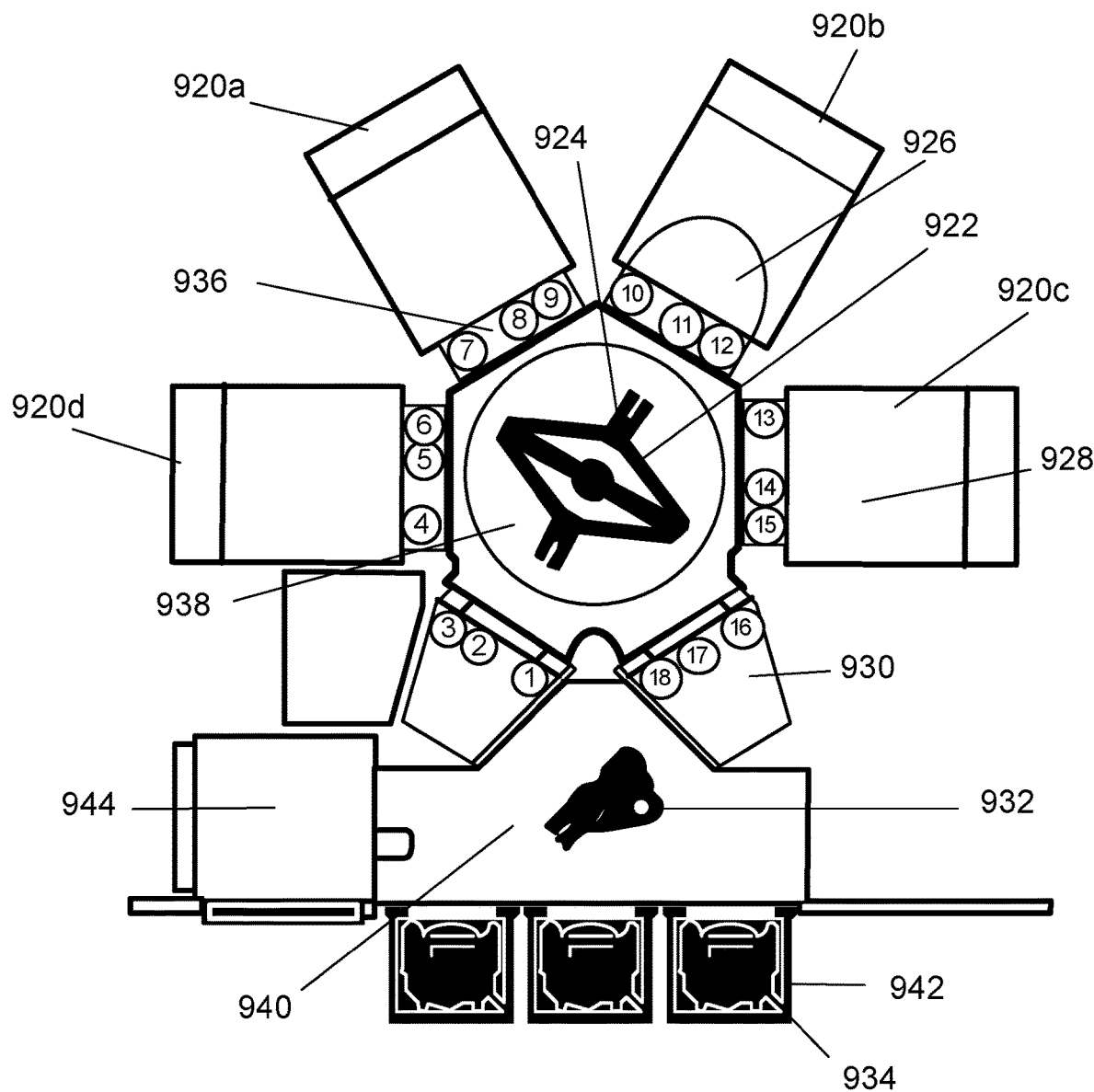
FIG. 9 is a schematic diagram of an example process tool for performing certain disclosed embodiments.

FIG. 9 depicts a semiconductor process cluster architecture with various modules that interface with a vacuum transfer module 938 (VTM). The arrangement of transfer modules to "transfer" wafers among multiple storage facilities and processing modules may be referred to as a "cluster tool architecture" system. Airlock 930, also known as a loadlock or transfer module, is shown in VTM 938 with four processing modules 920a-920d, which may be individual optimized to perform various fabrication processes. By way of example, processing modules 920a-920d may be implemented to perform substrate etching, deposition, ion implantation, wafer cleaning, sputtering, and/or other semiconductor processes. In some embodiments, ALD and selective etching are performed in the same module. In some embodiments, ALD and selective etching are performed in different modules of the same tool. One or more of the substrate etching processing modules (any of 920a-920d) may be implemented as disclosed herein, i.e., for depositing conformal films, selectively depositing films by ALD, etching patterns, and other suitable functions in accordance with the disclosed embodiments. Airlock 930 and process module 920 may be referred to as "stations." Each station has a facet 936 that interfaces the station to VTM 938. Inside each facet, sensors 1-18 are used to detect the passing of wafer 926 when moved between respective stations.

Robot 922 transfers wafer 926 between stations. In one embodiment, robot 922 has one arm, and in another embodiment, robot 922 has two arms, where each arm has an end effector 924 to pick wafers such as wafer 926 for transport. Front-end robot 932, in atmospheric transfer module (ATM) 940, is used to transfer wafers 926 from cassette or Front Opening Unified Pod (FOUP) 934 in Load Port Module (LPM) 942 to airlock 930. Module center 928 inside process module 920 is one location for placing wafer 926. Aligner 944 in ATM 940 is used to align wafers.

In an exemplary processing method, a wafer is placed in one of the FOUPs 934 in the LPM 942. Front-end robot 932 transfers the wafer from the FOUP 934 to an aligner 944, which allows the wafer 926 to be properly centered before it is etched or processed. After being aligned, the wafer 926 is moved by the front-end robot 932 into an airlock 930. Because airlock modules have the ability to match the environment between an ATM and a VTM, the wafer 926 is able to move between the two pressure environments without being damaged. From the airlock module 930, the wafer 926 is moved by robot 922 through VTM 938 and into one of the process modules 920a-920d. In order to achieve this wafer movement, the robot 922 uses end effectors 924 on each of its arms. Once the wafer 926 has been processed, it is moved by robot 922 from the process modules 920a-920d to an airlock module 930. From here, the wafer 926 may be moved by the front-end robot 932 to one of the FOUPs 934 or to the aligner 944.

It should be noted that the computer controlling the wafer movement can be local to the cluster architecture, or can be located external to the cluster architecture in the manufacturing floor, or in a remote location and connected to the cluster architecture via a network. A controller as described above with respect to FIG. 7 may be implemented with the tool in FIG. 9.

EXPERIMENTAL

An experiment was performed on boron-doped and phosphorous-doped silicon oxide films deposited using ALD and on an undoped silicon oxide film deposited using ALD.

The films were deposited to a thickness of about 500 Å at a deposition temperature of 200° C. The films were exposed to a $CF_4/CHF_3$ etch chemistry to determine the etch rate. Etching was performed for 15 seconds at 50° C. and 5 mTorr using a plasma ignited at a plasma power of 600 W in an ICP reactor with a bias voltage of 70 $V_b$. A projected etch selectivity was calculated for etch selectivity to spin-on carbon material. The results are shown in Table 1.

TABLE 1

| Etch Rate and Etch Selectivity of Doped Silicon Oxide | | |
| --- | --- | --- |
| Substrate | Etch Rate (Å/hr) | Projected Etch Selectivity of $SiO_2$ to Spin-on Carbon |
| Phosphorus-doped $SiO_2$ | 27221 | 4.1 |
| Boron-doped $SiO_2$ | 24754 | 3.7 |
| Undoped $SiO_2$ | 28116 | 4.2 |

The etch rate for boron-doped films was 15% slower than the etch rate of undoped $SiO_2$. The etch rate for phosphorous-doped films was 25% slower than the etch rate of updated $SiO_2$. These results suggest that the etch selectivity of doped silicon oxide materials to spin-on carbon materials may be improved such that spin-on carbon materials may etch at a faster rate relative to doped silicon oxide materials as opposed to spin-on carbon materials being etched relative to undoped silicon oxide materials.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of patterning a substrate using positive patterning, the method comprising:
   (a) providing the substrate having a patterned carbon-containing core material;
   (b) depositing a doped spacer conformally over the patterned carbon-containing core material;
   (c) etching the patterned carbon-containing core material selective to the doped spacer to form a mask, wherein etch rate of the patterned carbon-containing core material is between about 5 and about 20 times faster than etch rate of the doped spacer; and
   (d) etching a target layer using the mask.

2. The method of claim 1, wherein depositing the doped spacer comprises depositing one or more layers of silicon oxide and depositing one or more layers of a dopant oxide, the dopant selected from the group consisting of boron, gallium, phosphorous, aluminum, and arsenic.

3. The method of claim 2, further comprising after depositing the doped spacer and prior to selectively etching the patterned carbon-containing core material, annealing the substrate at a temperature less than about 400° C.

4. The method of claim 2, wherein the dopant is boron and depositing the one or more layers of the dopant oxide comprises exposing the substrate to a dopant precursor is selected from the group consisting of TMB (trimethylborate), TEB (triethylborate), $B_2H_6$ (diborane), trimethylborane, triethylborane, and combinations thereof.

5. The method of claim 2, wherein the dopant is phosphorous and depositing the one or more layers of the dopant oxide comprises exposing the substrate to a dopant precursor is selected from the group consisting of triethyl phosphate (TEPO) $(PO(OC_2H_5)_3)$; trimethyl phosphate (TMPO) $(PO(OCH_3)_3)$; trimethyl phosphite (TMPi) $(P(OCH_3)_3)$; trisdimethylaminophosphorus (TDMAP) $(((CH_3)_2N)_3P)$; phosphorous trichloride $(PCl_3)$; trismethylsilyl phosphine (TMSP) $(P(Si(CH_3)_3)_3)$; and phosphorus oxychloride $(POCl_3)$.

6. The method of claim 1, wherein depositing the doped spacer comprises:
 (i) exposing the substrate to a first dose of a silicon-containing precursor for a duration insufficient to saturate a surface of the substrate;
 (ii) exposing the substrate to a second dose of a dopant precursor for a duration insufficient to saturate the surface of the substrate to form a partially saturated surface of the silicon-containing precursor and the dopant on the surface of the substrate; and
 (iii) exposing the substrate to an oxidant to form a conformal doped silicon oxide material.

7. The method of claim 6, wherein the oxidant is selected from the group consisting of oxygen, carbon dioxide, water, nitrous oxide, and combinations thereof.

8. The method of claim 6, wherein exposing the substrate to the oxidant comprises flowing an inert gas selected from the group consisting of argon, nitrogen, and helium.

9. The method of claim 6, wherein a process chamber housing the substrate is purged between performing (i) and (ii).

10. The method of claim 1, wherein the patterned carbon-containing core material is etched by exposing the substrate to a fluorocarbon gas and igniting a plasma.

11. The method of claim 10, wherein the fluorocarbon gas is selected from the group consisting of $CF_4$, $CHF_3$, $CH_2F_2$, and $CH_3F$.

12. The method of claim 1, wherein the mask formed has a pitch less than about 50 nm.

13. The method of claim 1, wherein the doped spacer is deposited at a substrate temperature between about 50° C. and about 200° C.

14. The method of claim 1, wherein the doped spacer comprises a germanium-containing material deposited by depositing one or more layers of germanium oxide and the doped spacer is doped with phosphorous or argon.

15. The method of claim 1, wherein the doped spacer is deposited to a thickness between 50 Å and 300 Å.

16. The method of claim 1, wherein the doped spacer has a dopant density between about 1E20 at/cc and about 2E22 at/cc.

17. The method of claim 1, wherein depositing the doped spacer comprises depositing one or more layers of silicon oxide and depositing one or more layers of a dopant oxide, the dopant selected from the group consisting of boron, gallium, phosphorous, aluminum, and arsenic, and wherein depositing the doped spacer comprises:
 (i) exposing the substrate to a first dose of a silicon-containing precursor for a duration insufficient to saturate a surface of the substrate;
 (ii) exposing the substrate to a second dose of a dopant precursor for a duration insufficient to saturate the surface of the substrate to form a partially saturated surface of the silicon-containing precursor and the dopant on the surface of the substrate; and
 (iii) exposing the substrate to an oxidant to form a conformal doped silicon oxide material.

\* \* \* \* \*